United States Patent
Gray et al.

(10) Patent No.: US 8,851,200 B2
(45) Date of Patent: *Oct. 7, 2014

(54) BATTERY PACK FOR USE WITH A POWER TOOL AND A NON-MOTORIZED SENSING TOOL

(75) Inventors: Rick Gray, Bothell, WA (US); Paul Fry, Sussex, WI (US); Mike N. Jones, Lake Forest Park, WA (US); Scott Schneider, Waukesha, WI (US); Hugues Marie R. F. Sanoner, Hong Kong (CN)

(73) Assignee: Milwaukee Electric Tool Corporation, Brookfield, WI (US)

( * ) Notice: Subject to any disclaimer, the term of this patent is extended or adjusted under 35 U.S.C. 154(b) by 130 days.

This patent is subject to a terminal disclaimer.

(21) Appl. No.: 13/596,379

(22) Filed: Aug. 28, 2012

(65) Prior Publication Data

US 2012/0318546 A1    Dec. 20, 2012

Related U.S. Application Data

(63) Continuation of application No. 12/399,835, filed on Mar. 6, 2009, now Pat. No. 8,251,157.

(60) Provisional application No. 61/034,801, filed on Mar. 7, 2008, provisional application No. 61/043,455, filed on Apr. 9, 2008.

(51) Int. Cl.
| | |
|---|---|
| *B25F 3/00* | (2006.01) |
| *H01M 2/10* | (2006.01) |
| *G01R 1/22* | (2006.01) |
| *H01M 10/48* | (2006.01) |

(52) U.S. Cl.
CPC .............. *H01M 2/1055* (2013.01); *Y02E 60/12* (2013.01); *H01M 2220/30* (2013.01); *G01R 1/22* (2013.01); *H01M 10/488* (2013.01)
USPC .................. 173/29; 173/2; 173/170; 173/217

(58) Field of Classification Search
USPC ..................... 173/2, 29, 217, 170; 310/47, 50; 320/112, 114
See application file for complete search history.

(56) References Cited

U.S. PATENT DOCUMENTS

| | | |
|---|---|---|
| 2,796,760 A | 6/1957 | Warlam |
| 3,168,698 A | 2/1965 | Goody et al. |

(Continued)

FOREIGN PATENT DOCUMENTS

| | | |
|---|---|---|
| JP | 2002207057 | 7/2002 |
| WO | 9411162 | 5/1994 |

(Continued)

OTHER PUBLICATIONS

Combined Search and Examination Report from the Intellectual Property Office of Great Britain for Application No. GB1212510.1 dated Oct. 22, 2012 (8 pages).

(Continued)

*Primary Examiner* — Scott A. Smith
(74) *Attorney, Agent, or Firm* — Michael Best & Friedrich LLP

(57) ABSTRACT

A system includes a power tool having a motor, a drive mechanism mechanically coupled to the motor, and an output element mechanically coupled to the drive mechanism. The motor is operable to drive the drive mechanism and the output element. The system also includes a non-motorized sensing tool having a printed circuit board and a sensing element electrically coupled to the printed circuit board. The sensing element is operable to detect an external characteristic and output a signal to the circuit board. The circuit board is operable to condition the signal into a human-comprehensible form. The system further includes a rechargeable battery pack removably and independently coupled to the power tool and the non-motorized sensing tool to power the motor to drive the drive mechanism and the output element when connected to the power tool and the circuit board and the sensing element when connected to the non-motorized sensing tool.

37 Claims, 12 Drawing Sheets

(56) References Cited

U.S. PATENT DOCUMENTS

| | | |
|---|---|---|
| 3,254,446 A | 6/1966 | Endris |
| 3,999,110 A | 12/1976 | Ramstrom et al. |
| 4,005,605 A | 2/1977 | Michael |
| 4,084,123 A | 4/1978 | Lineback |
| 4,112,764 A | 9/1978 | Turner |
| 4,634,294 A | 1/1987 | Christol et al. |
| 4,880,713 A | 11/1989 | Levine |
| 4,989,450 A | 2/1991 | Shoberg et al. |
| 5,373,317 A | 12/1994 | Salvati et al. |
| 5,477,622 A | 12/1995 | Skalnik |
| 5,610,512 A | 3/1997 | Selcuk |
| 5,626,139 A | 5/1997 | Szeles et al. |
| 5,707,137 A | 1/1998 | Hon |
| 5,736,271 A | 4/1998 | Cisar et al. |
| 5,736,726 A | 4/1998 | VanHorn et al. |
| 5,879,289 A | 3/1999 | Yarush et al. |
| 6,001,058 A | 12/1999 | Sano et al. |
| 6,091,453 A | 7/2000 | Coan et al. |
| 6,095,682 A | 8/2000 | Hollander et al. |
| 6,186,959 B1 | 2/2001 | Canfield et al. |
| 6,211,662 B1 | 4/2001 | Bijawat et al. |
| 6,221,007 B1 | 4/2001 | Green |
| 6,329,788 B1 | 12/2001 | Bailey, Jr. et al. |
| 6,419,627 B1 | 7/2002 | Nun |
| 6,501,197 B1 | 12/2002 | Cornog et al. |
| 6,509,555 B1 | 1/2003 | Riess et al. |
| 6,771,043 B2 | 8/2004 | Matsunaga et al. |
| 6,847,394 B1 | 1/2005 | Hansen et al. |
| 7,157,705 B2 | 1/2007 | Hamrelius et al. |
| 7,163,336 B2 | 1/2007 | Blakeley, III |
| 7,186,000 B2 | 3/2007 | Lebens et al. |
| 7,199,832 B2 | 4/2007 | Oran |
| D559,386 S | 1/2008 | Pease et al. |
| D560,804 S | 1/2008 | Pease et al. |
| 7,384,308 B2 | 6/2008 | Boehnlein et al. |
| 7,431,619 B2 | 10/2008 | Boehnlein et al. |
| 7,600,885 B2 | 10/2009 | Canino et al. |
| 7,633,282 B2 | 12/2009 | Radle et al. |
| 7,719,230 B2 | 5/2010 | Griffin |
| 8,251,157 B2 * | 8/2012 | Gray et al. ............... 173/29 |
| 8,274,273 B2 | 9/2012 | Nguyen et al. |
| 2002/0101230 A1 | 8/2002 | Gregorec, Jr. et al. |
| 2003/0016856 A1 | 1/2003 | Walker et al. |
| 2003/0058638 A1 | 3/2003 | Gillette |
| 2003/0114839 A1 | 6/2003 | Looper et al. |
| 2003/0218469 A1 | 11/2003 | Brazell et al. |
| 2004/0054254 A1 | 3/2004 | Miyake |
| 2004/0133075 A1 | 7/2004 | Motoki et al. |
| 2004/0242958 A1 | 12/2004 | Fujikawa et al. |
| 2005/0129108 A1 | 6/2005 | Bendall et al. |
| 2005/0143626 A1 | 6/2005 | Prescott |
| 2005/0229698 A1 | 10/2005 | Beecroft et al. |
| 2005/0267776 A1 | 12/2005 | Selby et al. |
| 2006/0004258 A1 | 1/2006 | Sun et al. |
| 2006/0076385 A1 | 4/2006 | Etter et al. |
| 2006/0087286 A1 | 4/2006 | Phillips et al. |
| 2006/0091858 A1 | 5/2006 | Johnson et al. |
| 2006/0092674 A1 | 5/2006 | Belton et al. |
| 2006/0098779 A1 | 5/2006 | Turner |
| 2006/0113958 A1 | 6/2006 | Lobert et al. |
| 2006/0155168 A1 | 7/2006 | Pease |
| 2006/0155589 A1 | 7/2006 | Lane et al. |
| 2006/0167340 A1 | 7/2006 | Pease et al. |
| 2006/0215728 A1 | 9/2006 | Jang |
| 2006/0221598 A1 | 10/2006 | March et al. |
| 2006/0281972 A1 | 12/2006 | Pease et al. |
| 2007/0086508 A1 | 4/2007 | Reading et al. |
| 2007/0185379 A1 | 8/2007 | Newman et al. |
| 2007/0240892 A1 | 10/2007 | Brotto et al. |
| 2008/0009677 A1 | 1/2008 | Shoroji et al. |
| 2008/0036644 A1 | 2/2008 | Skultety-Betz et al. |
| 2008/0158349 A1 | 7/2008 | Miller et al. |
| 2008/0196910 A1 | 8/2008 | Radle et al. |
| 2008/0248673 A1 | 10/2008 | Boehnlein et al. |
| 2008/0259993 A1 | 10/2008 | Blakeley |
| 2008/0272761 A1 | 11/2008 | Sanoner et al. |
| 2009/0109045 A1 | 4/2009 | Delmonico et al. |
| 2009/0125330 A1 | 5/2009 | Sebban |
| 2009/0262782 A1 | 10/2009 | Ko et al. |
| 2010/0046577 A1 | 2/2010 | Sheard et al. |

FOREIGN PATENT DOCUMENTS

| | | |
|---|---|---|
| WO | 9715144 | 4/1997 |
| WO | 0030526 | 6/2000 |

OTHER PUBLICATIONS

Office Action from the United States Patent and Trademark Office for U.S. Appl. No. 13/626,667 dated Dec. 7, 2012 (6 pages).

Examination Report from the Intellectual Property Office of Great Britain for Application No. GB1212510.1 dated Dec. 24, 2012 (3 pages).

Examination Report from the Intellectual Property Office of Great Britain for Application No. GB1212510.05 dated Jan. 24, 2013 (1 page).

Examination Report from the Intellectual Property Office of Great Britain for Application No. GB1212510.05 dated Feb. 26, 2013 (2 pages).

CN2009801148145 Chinese Office Action received Mar. 18, 2013 (17 pages).

Second Office action from the Australian Intellectual Property Office for Application No. 2009234158 dated Jul. 4, 2013 (4 pages).

Examination Report from the United Kingdom Intellectual Property Office for Application No. 1210676.1 dated Nov. 14, 2012 (1 page).

United States Patent Office Action for U.S. Appl. No. 13/626,667 dated Sep. 17, 2013 (11 pages).

Office Action from the United States Patent and Trademark Office for U.S. Appl. No. 12/421,455 dated May 24, 2012 (17 pages).

Office Action from the United States Patent and Trademark Office for U.S. Appl. No. 12/936,808 dated May 17, 2012 (11 pages).

Office Action from the United States Patent and Trademark Office for U.S. Appl. No. 12/554,684 dated Apr. 23, 2012 (21 pages).

Chicago Electric Power Tools, 18 Volt Cordless Chainsaw, 2000, available at http://images.harborfreight.com/manuals/44000-44999/44493.PDF.

Great Britain Application No. 1,014,984.7 Examiner's Report dated Jun. 21, 2011 (2 pages).

Office Action from the United States Patent Office for U.S. Appl. No. 12/399,755 dated Oct. 4, 2011 (6 pages).

Office Action from the United States Patent Office for U.S. Appl. No. 12/421,455 dated Oct. 31, 2011 (14 pages).

Office Action from the United States Patent Office for U.S. Appl. No. 12/554,684 dated Nov. 9, 2011 (18 pages).

Office Action from the United States Patent Office for U.S. Appl. No. 12/936,808 dated Jul. 12, 2011 (13 pages).

Hitting Shelves Oct. 2010: DeWalt's New Line of 12v Max Compact Cordless Power Tools, Retrieved from <http://www.prweb.com/releases/2010/10/prweb4612064.htm>, Prweb Online Visibility news release on Oct. 6, 2010, pp. 1-2, Salt Lake City, Utah, USA.

DeWalt Releases 12-Volt Max Tools dated Jun. 28, 2010, Available online at: Tool Snob.com, Retrieved from <http://www.toolsnob.com/archives/2010/06/dewalt_releases_12-volt> on Oct. 6, 2010, pp. 1-4.

Black & Decker, 3.6 Volt VersaPak Batteries and Chargers, Instruction Manual, 2 pages.

BW Technologies by Honeywell, GasAlertMax H2S, CO, O2 and Combustibles Multi-Gas Detector, 2 pages, dated 2007.

BW Technologies by Honeywell, GasAlert Max H2S, CO, O2 and Combustibles 1, 2, 3, and 4 Gas Detectors, User Manual, 72 pages, dated 2006.

PCT/US2009/036399 International Search Report and Written Opinion, 9 pages, dated May 11, 2009.

V18 Lithium-Ion System, Milwaukee Electric Tool Corporation, 2006-2007 Catalog, p. 17, CAT2006-07/9-06/500m/IPC, Printed in USA.

Testing and Measurement, Greenlee: A Textron Company, pp. 308-350, publicly available before Mar. 6, 2009.

International Safety Systems Inc.: Fire, Safety and Industrial Supplies, 16 pages, published in 2007.

(56) References Cited

OTHER PUBLICATIONS

PS200 Ferroscan, Hilti USA, Available online at: <http://www.us.hilti.com/holus/modules/prcat/prca_fuse.jsp?RANGE_OID=35223>, 1 page, printed Apr. 21, 2009, publicly available before Mar. 6, 2009.
Extech Instruments, New Products Fall 2004, 12 pages, 2004.
Heavy-Duty 18V Cordless Rotary Laser—Combo Kit (Int/Ext)—DW073KD, DeWalt, available online at: <http://www.dewalt.com/us/products/tool_detail.asp?productID=2901>, 2 pages, printed Jun. 5, 2009, publicly available before Mar. 6, 2009.
Extech Instruments: Newly Patented EX470 Combination Multimeter/IR Thermometer, New Equipment Digest, available online at: <http://www.newequipment.com/303/ProductDetail/62102/303-6550/ Newly_Patented_EX470_Combination_Multimeter_IR_Thermometer.aspx>, 2 pages, printed Apr. 16, 2009, published Jun. 19, 2007.
Fluke T5-600/62/1AC IR Thermometer, Electrical Tester and Voltage Detector Kit, Fluke, available online at: <http://us.fluke.com/usen/products/62+T5+Kit.htm?catalog_name=FlukeUnitedStates&category=INFTHE (FlukeProducts)>, 2 pages, printed Apr. 21, 2009, publicly available before Mar. 6, 2009.
Oscilloscopes for Field Applications, Fluke, 5 pages, publicly available before Mar. 6, 2009.
ThermaCam P620 Infrared Camera, FLIR Systems: The Global Leader in Infrared Cameras, 2 pages, publicly available before Mar. 6, 2009.
D-tect 100 Bosch Wall Scanner Bosch D-tect 100, Power Tools UK, available online at: <http://www.powertoolsuk.co.uk/webcat/details.asp?ProductCode=D-tect%20100&ID=957>, 1 page, printed Apr. 21, 2009, publicly available before Mar. 6, 2009.
BP120 Rechargeable Ni-Cad Battery Pack, Fluke, available online at: <http://us.fluke.com/usen/products/AccessoryDetail.htm?cs_id=8301%28FlukeProducts%29&catalog_name=FlukeUnitedStates&category=BATT(FlukeProducts)>, 1 page, printed Jun. 5, 2009, publicly available before Mar. 6, 2009.
MS2008B 3 3/4 Mini Autorange Digital Clamp Meter, Precision Mastech Enterprises Co., Ltd., Available online at: <http://www.p-mastech.com/products/05_acdcdcm/ms2008b.html>, 1 page, printed Aug. 15, 2008, publicly available before Mar. 6, 2009.
116/322 HVAC Combo Kit, Fluke, available online at: <http://us.fluke.com/usen/products/16+322+KIT.htm?catalog_name=FlukeUnitedStates&category=HMA(FlukeProducts)>, 1 page, printed Apr. 21, 2009, publicly available before Mar. 6, 2009.
62/322/1AC IR Thermometer, Clamp Meter and Voltage Detector Kit, Fluke, available online at: <http://us.fluke.com/usen/products/62+322+Kit.htm?catalog_name=FlukeUnitedStates&category=INFTHE (FlukeProducts)>, 1 page, printed Apr. 21, 2009, publicly available before Mar. 6, 2009.
Office Action from the Australian Patent Office for Application No. 2009234158 dated Jul. 4, 2012 (5 pages).
Office Action from the Australian Patent Office for Application No. 2009221762 dated Jun. 8, 2012 (2 pages).
PCT/US2009/036395 International Search Report and Written Opinion, 14 pages, dated May 5, 2009.
Great Britain Application No. 1,121,678.5 Examiner's Report dated Oct. 23, 2012 (1 page).
Office Action from the United States Patent and Trademark Office for U.S. Appl. No. 12/421,455 dated Sep. 18, 2012 (16 pages).
PCT/US2009/040101 International Search Report and Written Opinion, 11 pages, dated Jul. 31, 2009.
Great Britain Application No. 1,121,676.1 Examiner's Report dated Jul. 4, 2012 (5 pages).
Search Report from the European Patent Office for Application No. 09717382.7 dated Aug. 20, 2012 (15 pages).
Search Report from the European Patent Office for Application No. 1212510.0 dated Oct. 23, 2012 (5 pages).
Office action from the Canadian Intellectual Property Office for Application No. 2717860 dated Mar. 20, 2014 (4 pages).

* cited by examiner

BATTERY PACK FOR USE WITH A POWER TOOL AND A NON-MOTORIZED SENSING TOOL

RELATED APPLICATIONS

This application is a continuation of previously-filed, co-pending U.S. patent application Ser. No. 12/399,835, filed Mar. 6, 2009, the entire content of which is hereby incorporated by reference. U.S. patent application Ser. No. 12/399,835 claims the benefit of U.S. Provisional Patent Application No. 61/034,801, filed Mar. 7, 2008 and U.S. Provisional Patent Application No. 61/043,455, filed Apr. 9, 2008, the entire contents of both of which are also hereby incorporated by reference.

BACKGROUND

The present invention relates to battery packs and, more particularly, to battery packs for use with both power tools and non-motorized sensing tools.

Battery packs are often usable with a variety of different cordless power tools. For example, a single battery back may be independently connected to a screwdriver, a drill, and a reciprocating saw (as well as other types of power tools) to provide power to the tools. Such power tools typically include relatively heavy motors and drive mechanisms such that the additional weight of a battery pack is negligible.

Unlike cordless power tools, non-motorized sensing tools (e.g., visual inspection devices, wall scanners, thermometers, digital multimeters, clamp meters, etc.) are generally lightweight tools. These tools typically include printed circuit boards having processors (rather than motors) and are powered by standard alkaline-based AA, AAA, or 9V batteries. Additionally, as a result of their size and weight, nickel-cadmium (NiCd) and nickel-metal hydride (NiMH) power tool battery packs cannot reasonably be used with these devices. As such, if a user is using both types of tools for a particular job or project, it is inconvenient for the user to keep both a power tool battery pack and alkaline-based batteries on hand, and if the battery pack and the alkaline-based batteries are rechargeable, it is also inconvenient to keep multiple types and sizes of chargers on hand for the different batteries.

SUMMARY

In one embodiment, the invention provides a system including a power tool having a motor, a drive mechanism mechanically coupled to the motor, and an output element mechanically coupled to the drive mechanism. The motor is operable to drive the drive mechanism and the output element. The output element produces an output force when driven by the drive mechanism. The system also includes a non-motorized sensing tool having a printed circuit board and a sensing element electrically coupled to the printed circuit board. The sensing element is operable to detect an external characteristic and output a signal indicative of the detected characteristic to the printed circuit board. The printed circuit board is operable to condition the signal into a human-comprehensible form. The system further includes a rechargeable battery pack removably and independently coupled to the power tool and the non-motorized sensing tool. The battery pack is operable to power the motor to drive the drive mechanism and the output element when connected to the power tool, and is operable to power the printed circuit board and the sensing element when connected to the non-motorized sensing tool.

In another embodiment, the invention provides a system including a first non-motorized sensing tool having a first printed circuit board, a first sensing element electrically coupled to the first printed circuit board, and a display electrically coupled to the first printed circuit board. The first sensing element is operable to transmit image data of a remote object to the first printed circuit board. The first printed circuit board is operable to condition the image data. The display is operable to display an image of the remote object based on the conditioned image data. The system also includes a second non-motorized sensing tool having a second printed circuit board and a second sensing element electrically coupled to the second printed circuit board. The second sensing element is operable to detect a measurable characteristic of an object and output a signal indicative of the measurable characteristic to the second printed circuit board. The second printed circuit board is operable to condition the signal into a human-comprehensible form. The system further includes a rechargeable battery pack having at least one lithium-ion battery cell. The rechargeable battery pack is removably and independently coupled to the first non-motorized sensing tool and the second non-motorized sensing tool. The battery pack is operable to power the first printed circuit board, the first sensing element, and the display when connected to the first non-motorized sensing tool, and is operable to power the second printed circuit board and the second sensing element when connected to the second non-motorized sensing tool.

In still another embodiment, the invention provides a system including a power tool having a first housing defining a first opening, a motor positioned substantially within the first housing, and a drive mechanism positioned substantially within the first housing and mechanically coupled to the motor. The motor is operable to drive the drive mechanism. The power tool also includes a first battery terminal supported by the first housing and positioned within the first opening. The system also includes a non-motorized sensing tool having a second housing defining a second opening, a printed circuit board positioned substantially within the second housing, and a sensing element positioned substantially within the second housing and electrically coupled to the printed circuit board. The sensing element is operable to detect an external characteristic and output a signal indicative of the detected characteristic to the printed circuit board. The printed circuit board is operable to condition the signal into a human-comprehensible form. The non-motorized sensing tool also includes a second battery terminal supported by the second housing and positioned within the second opening. The system further includes a rechargeable battery pack removably and independently coupled to the power tool and the non-motorized sensing tool. A portion of the battery pack is insertable into the first opening of the power tool to engage the first battery terminal and substantially enclose the first opening. The portion of the battery pack is insertable into the second opening of the non-motorized sensing tool to engage the second battery terminal and substantially enclose the second opening. The first battery terminal and the second battery terminal are generally exposed when the portion of the battery pack is removed from the first opening and the second opening, respectively.

Other aspects of the invention will become apparent by consideration of the detailed description and accompanying drawings.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein are for the purpose of description and should not be regarded as limiting.

DETAILED DESCRIPTION

Figure 1:
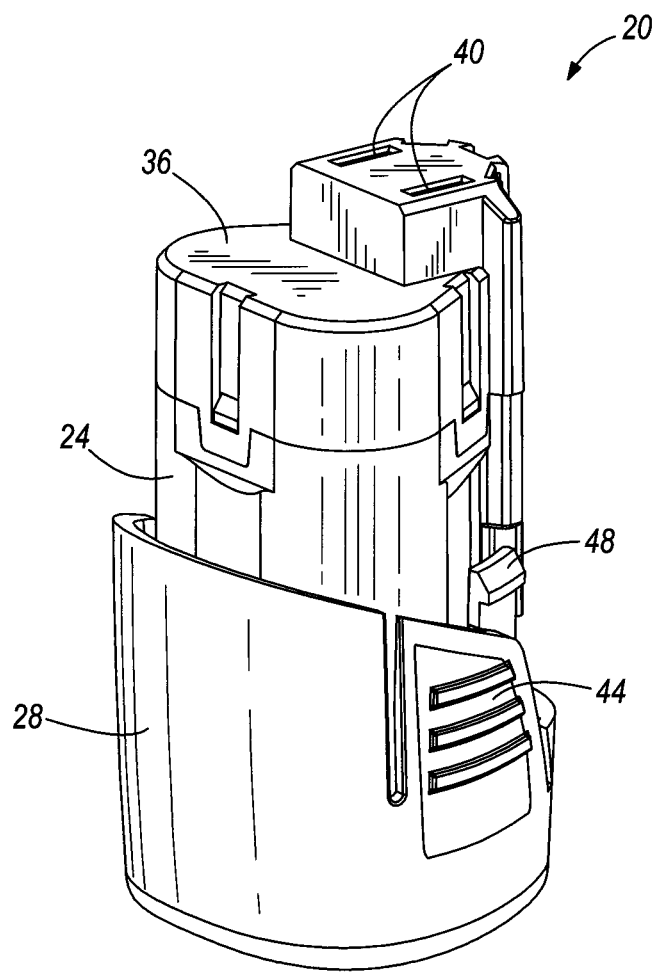
FIG. 1 is a perspective view of a battery pack embodying the invention.
Figure 2A:
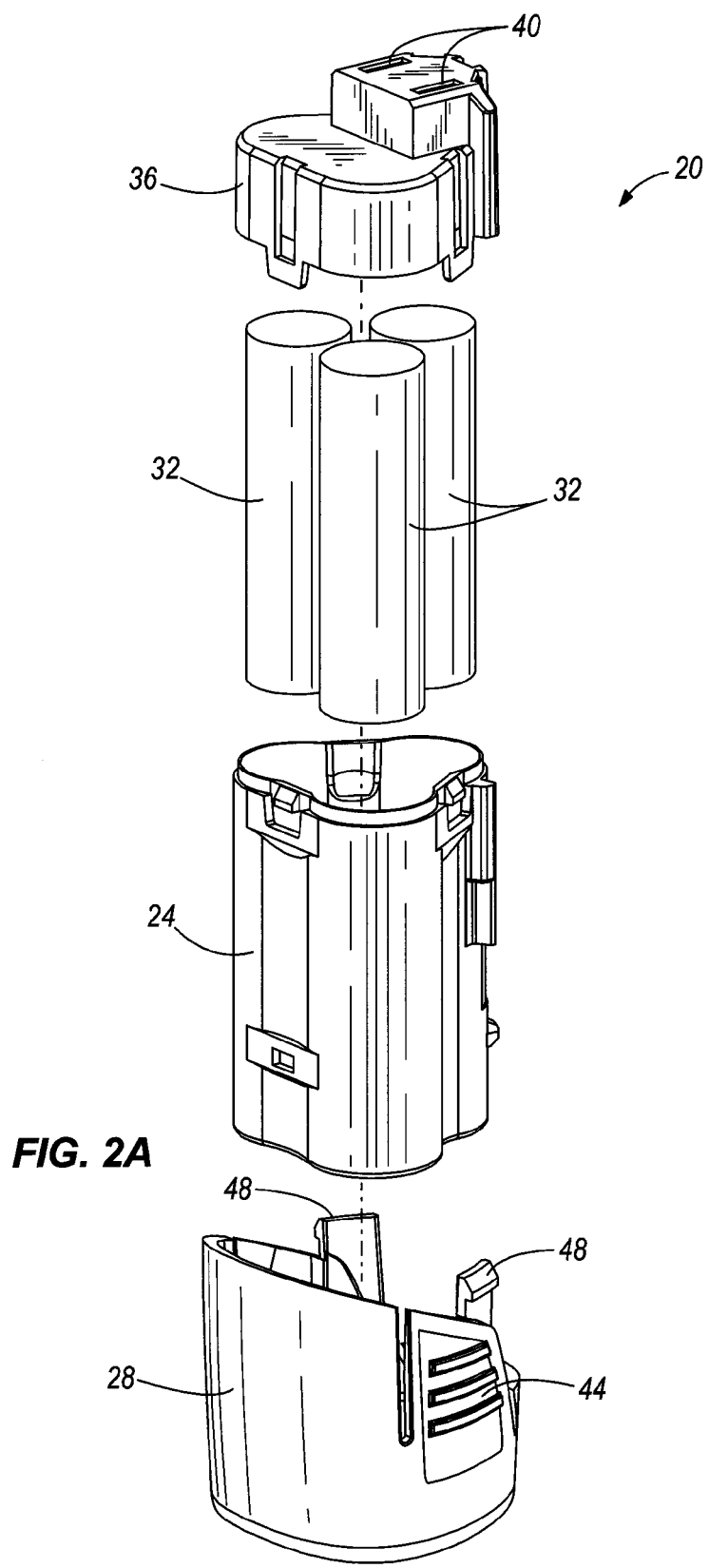
FIG. 2A is an exploded perspective view of the battery pack shown in FIG. 1.
Figure 2B:
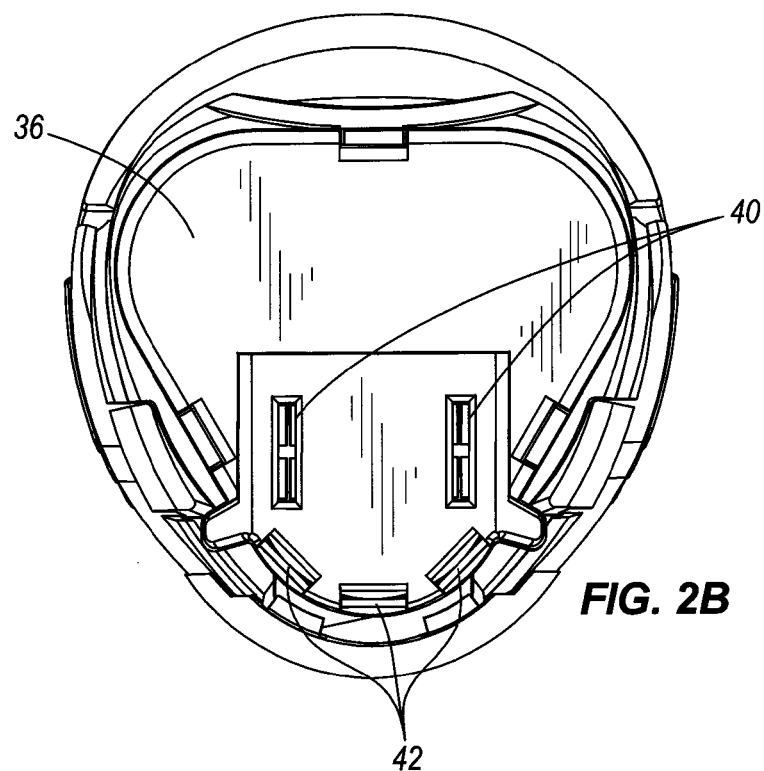
FIG. 2B is a top view of the battery pack shown in FIG. 1.

FIGS. 1, 2A and 2B illustrate a battery pack 20 for use with a variety of devices. In the illustrated embodiment, the battery pack 20 is a lithium-based, rechargeable battery pack for use with both power tools and non-motorized sensing tools. The battery pack 20 is removably and interchangeably connected to the tools to provide power during operation and to facilitate recharging of the battery pack 20 when not in use. In some embodiments, the battery pack 20 may be used with other types of cordless, battery-powered tools or devices not specifically discussed below.

The illustrated battery pack 20 includes a casing 24, an outer housing 28 coupled to the casing 24, and a plurality of battery cells 32 (FIG. 2A) positioned within the casing 24. The casing 24 is shaped and sized to fit within an opening and cavity in a power tool or non-motorized sensing tool to connect the battery pack 20 to the tool. The casing 24 includes an end cap 36 to substantially enclose the battery cells 32 within the casing 24. The illustrated end cap 36 includes two power terminals 40 configured to mate with corresponding power terminals extending from a tool. In other embodiments, the end cap 36 may include terminals that extend from the battery pack 20 and are configured to be received in receptacles supported by a tool. The end cap 36 also includes sense or communication terminals 42 (shown in FIG. 2B) that are configured to mate with corresponding terminals from a tool. The terminals 42 couple to a battery circuit (not shown). The battery circuit can be configured to monitor various aspects of the battery pack 20, such as pack temperature, pack and/or cell state of charge, etc. and can also be configured to send and/or receive information and/or commands to and/or from a tool. In one embodiment, the battery circuit operates as illustrated and described in U.S. Pat. No. 7,157,882 entitled "METHOD AND SYSTEM FOR BATTERY PROTECTION EMPLOYING A SELECTIVELY-ACTUATED SWITCH," issued Jan. 2, 2007, the entire contents of which are hereby incorporated by reference. In another embodiment, the battery circuit operates as illustrated and described in U.S. Patent Publication No. 2006/0091858 entitled "METHOD AND SYSTEM FOR BATTERY PROTECTION," filed May 24, 2005, the entire contents of which are also hereby incorporated by reference.

The casing 24 and the receptacles 40 substantially enclose and cover the terminals on the tool when the pack 20 is positioned within the opening. That is, the battery pack 20 functions as a cover for the opening and terminals of the tool. Once the battery pack 20 is disconnected from the tool and the casing 24 is removed from the opening, the battery terminals on the tool are generally exposed to the surrounding environment.

The outer housing 28 is coupled to an end of the casing 24 substantially opposite the end cap 36 and surrounds a portion of the casing 24. In the illustrated construction, when the casing 24 is inserted into or positioned within the corresponding opening in the tool, the outer housing 28 generally aligns with an outer surface of the tool. In this construction, the outer housing 28 is designed to substantially follow the contours of the tool to match the general shape of the tool. In some embodiments, such as the embodiments discussed below, the casing 24 is inserted into a grip of a power tool or a non-motorized sensing tool. In such embodiments, the outer housing 28 generally increases (e.g., extends) the length of the grip of the tool.

In the illustrated embodiment, two actuators 44 (only one of which is shown) and two tabs 48 are formed in the outer housing 28 of the battery pack 20. The actuators 44 and the tabs 48 define a coupling mechanism to releasably secure the battery pack 20 to a power tool or non-motorized sensing tool. Each tab 48 engages a corresponding recess formed in a tool to secure the battery pack 20 in place. The tabs 48 are normally biased away from the casing 24 (i.e., away from each other) due to the resiliency of the material forming the outer housing 28. Actuating (e.g., depressing) the actuators 44 moves the tabs 48 toward the casing 24 (i.e., toward each other) and out of engagement with the recesses such that the battery pack 20 may be pulled out of the opening and away from the tool. Such an arrangement allows a user to quickly remove the battery pack 20 from the tool for recharging or replacement without the use of tools. In other embodiments, the battery pack 20 may include other suitable coupling mechanisms to releasably secure the battery pack 20 to a tool, as discussed below.

As shown in FIG. 2A, the battery pack 20 includes three battery cells 32 positioned within the casing 24 and electrically coupled to the terminals 40. The battery cells 32 provide operational power (e.g., DC power) to a power tool or non-motorized sensing tool. In the illustrated embodiment, the battery cells 32 are arranged in series, and each battery cell 32 has a nominal voltage of approximately four-volts (4.0V), such that the battery pack 20 has a nominal voltage of approximately twelve-volts (12V). The cells 32 also have a capacity rating of approximately 1.4 Ah. In other embodiments, the battery pack 20 may include more or fewer battery cells 32, and the cells 32 can be arranged in series, parallel, or a serial and parallel combination. For example, the pack 20 can include a total of six battery cells 32 in a parallel arrangement of two sets of three series-connected cells 32. The series-parallel combination of battery cells creates a battery pack having a nominal voltage of approximately 12V and a capacity rating of approximately 2.8 Ah. In other embodiments, the battery cells 32 may have different nominal voltages, such as, for example, 3.6V, 3.8V, 4.2V, etc., and/or may have different capacity ratings, such as, for example, 1.2 Ah, 1.3 Ah, 2.0 Ah, 2.4 Ah, 2.6 Ah, 3.0 Ah, etc. In other embodiments, the battery pack 20 can have a different nominal voltage, such as, for example, 10.8V, 14.4V, etc. In the illustrated embodiment, the battery cells 32 are lithium-ion battery cells having a chemistry of, for example, lithium-cobalt (Li—Co), lithium-manganese (Li—Mn), or Li—Mn spinel. In other embodiments, the battery cells 32 may have other suitable lithium or lithium-based chemistries.

Figure 3:
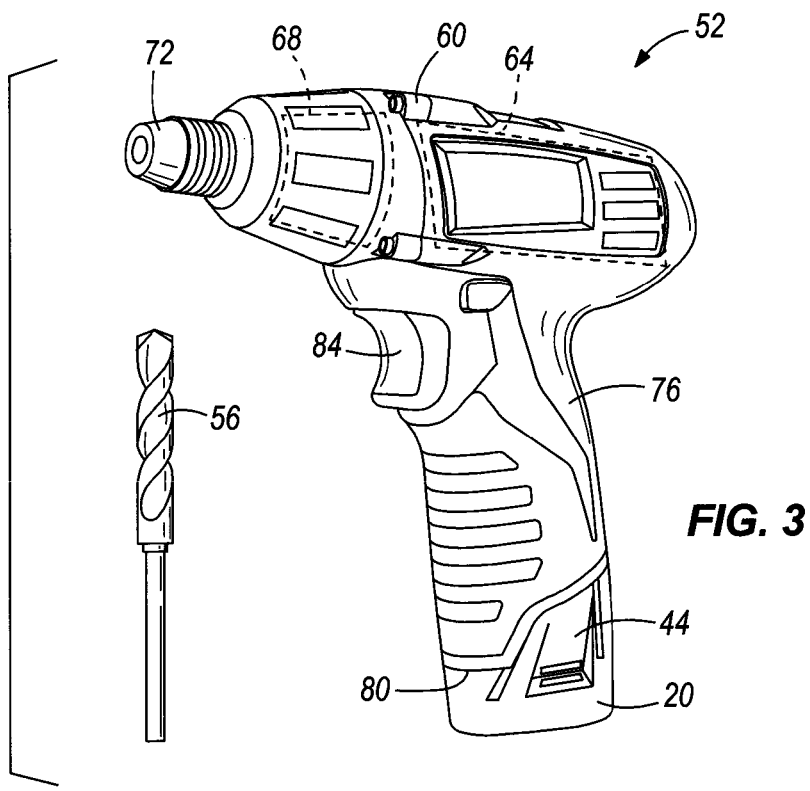
FIG. 3 is a perspective view of a drill for use with the battery pack shown in FIG. 1.

FIG. 3 illustrates one example of a motorized tool, such as power tool 52 for use with the battery pack 20. In the illustrated embodiment, the power tool 52 is a screwdriver or drill operable to drive a tool element. The tool element can be, for example, a power tool accessory such as a drill bit 56 (e.g., a twist bit, a spade bit, an auger bit, a masonry bit, an installer bit, etc.). In other embodiments, the drill 52 may drive other accessories, such as screwdriver bits, drill or bit adaptors, or the like. In still other embodiments, the power tool 52 may be a different type of power tool such as, for example, a reciprocating saw, a circular saw, a pipe cutter, an impact driver, or the like, which can be used for power tool applications such as drilling, fastening, cutting, and material removal. In additional embodiments, the tool can be a different type of motorized tool which drives an output element such as a tape roll for a label maker or an ink cartridge for a printer.

The illustrated drill 52 includes a housing 60, a motor 64 positioned substantially within the housing 60, a drive mechanism 68 mechanically coupled to the motor 64, and a chuck 72 mechanically coupled to the drive mechanism 68. The housing 60 includes a grip 76 extending generally perpendicular relative to the motor 64 and the drive mechanism 68 to support the battery pack 20. An opening in communication with a cavity is formed in an end 80 of the grip 76 to receive the casing 24 (FIGS. 1 and 2A) of the battery pack 20. As discussed above, the tabs 48 (FIGS. 1 and 2A) of the battery pack 20 engage corresponding recesses formed on an inner surface of the cavity to releasably secure the battery pack 20 to the drill 52. In some embodiments, the drill 52 includes one or more LEDs for providing an indication to the user of the status of the drill 52, the battery pack 20, or both.

The motor 64 is coupled to the drive mechanism 68 to drive the drive mechanism 68 and rotate the chuck 72. In some embodiments, the motor 64, the drive mechanism 68, and the chuck 72 may output, for example, approximately 150 in-lbs of force. The chuck 72 receives and clamps the drill bit 56 (or other accessory) for rotation with the chuck 72. As the drill bit 56 rotates, the bit 56 outputs a force to cut a hole in a work piece. In other embodiments, other output elements, such as a screwdriver bit, may be coupled to the chuck 72 to, for example, rotate and drive a screw into a work piece.

As shown in FIG. 3, the drill 52 also includes a trigger 84 supported by the housing 60 adjacent to the grip 76. The trigger 84 is electrically coupled between the battery pack 20 and the motor 64 to selectively provide power to the motor 64. Actuating the trigger 84 thereby controls operation of the drill 52 by rotating the motor 64 and the chuck 72 in a forward and/or reverse direction.

The drill 52 may also include a tool circuit (not shown) coupled to one or more sense terminals or communication terminals (not shown). The tool circuit includes, among other things, at least one switch for control and protection of the tool and battery pack. For example, in one embodiment, the tool circuit includes a semi-conductor switch, such as a field effect transistor (FET), within a speed control circuit. Additionally or alternatively, the tool circuit includes a FET separate from the speed control circuit. The tool circuit is operable to monitor a plurality of conditions of the tool including, but not limited to, the temperature of the motor and an amount of current drawn from the battery pack. In some embodiments, the tool circuit is operable to communicate with a control or protection circuit located within the battery pack. In an illustrative embodiment, the battery pack and the tool circuit each include a processor or controller. The controllers are, for example, microprocessors, microcontrollers, or the like, and are configured to communicate with one another. For example, the battery pack controller can provide information to the tool circuit controller related to a battery pack temperature or voltage level. The power tool circuit and the battery pack also include low voltage monitors and state-of-charge monitors. The monitors are used by the tool circuit or the battery pack to determine whether the battery pack is experiencing a low voltage condition which may prevent proper operation of the drill, or if the battery pack is in a state-of-charge that makes the battery pack susceptible to being damaged. If such a low voltage condition or state-of-charge exists, the drill is shut down or the battery pack is otherwise prevented from further discharging current to prevent the battery pack from becoming further depleted.

Figure 4:
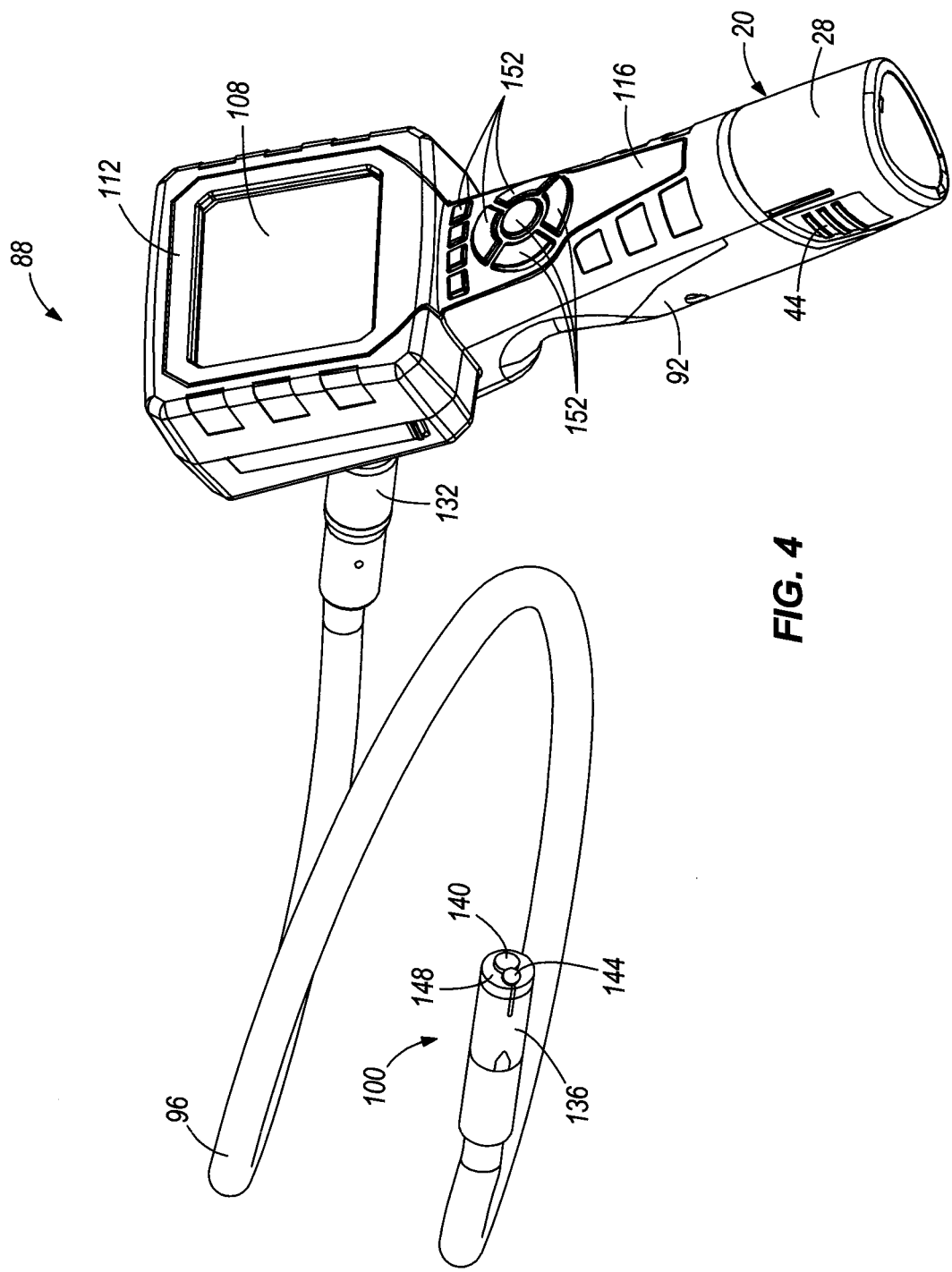
FIG. 4 is a perspective view of a visual inspection device for use with the battery pack shown in FIG. 1.
Figure 5:
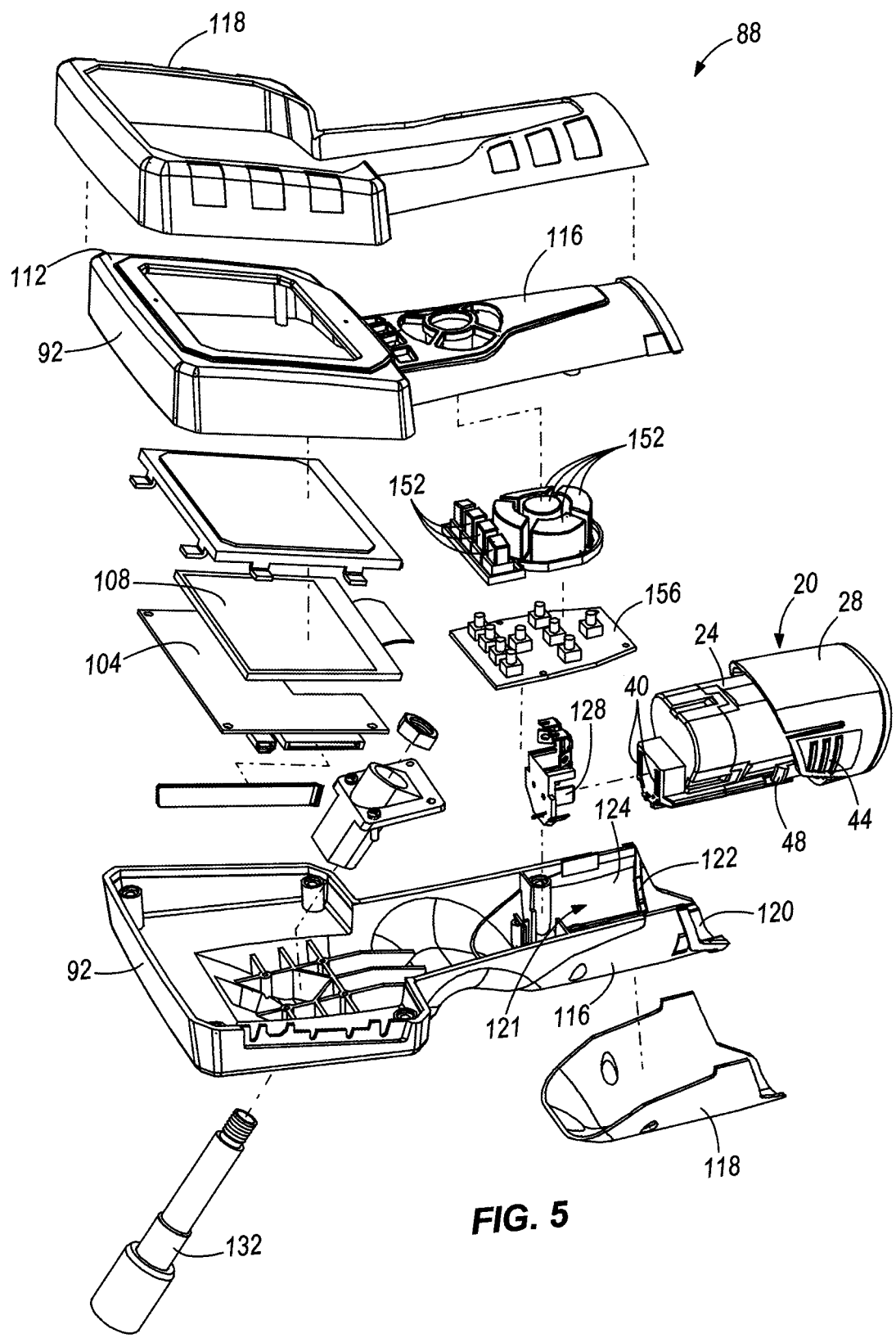
FIG. 5 is an exploded perspective view of the visual inspection device shown in FIG. 4.

FIGS. 4 and 5 illustrate one example of a non-motorized sensing tool 88 for use with the battery pack 20. In the illustrated embodiment, the sensing tool 88 is a visual inspection device for viewing the interior of a confined space such as, for example, a pipe, a wall, a floor, an engine, or the like. The inspection device 88 allows an operator (e.g., a plumber, an electrician, a mechanic, etc.) to view locations that are otherwise inaccessible without first dismantling or removing surrounding structures. One example of a visual inspection device is illustrated and described in U.S. patent application Ser. No. 12/399,755 entitled "VISUAL INSPECTION DEVICE", filed Mar. 6, 2009, the entire contents of which is hereby incorporated by reference.

The illustrated visual inspection device 88 includes a housing 92, a flexible cable 96 coupled to and extending from the housing 92, a camera assembly 100 coupled to the flexible cable 96, a circuit such as, for example, a printed circuit board (PCB) 104 (FIG. 5) positioned substantially within the housing 92, and a display 108 supported by the housing 92. The housing 92 includes a support portion 112 for supporting the display 108 and a grip 116 extending from the support portion 112. An elastomeric overmold 118, or skin, is coupled to the housing 92 to facilitate gripping of the support portion 112 and to help protect the device 88 if the device 88 is banged into a surface or dropped.

Similar to the drill 52 discussed above, the grip 116 of the inspection device 88 defines an opening 120 in communication with a cavity 121 to receive the casing 24 of the battery pack 20. As shown in FIG. 5, the tabs 48 of the battery pack 20 engage recesses 122 formed on an inner surface 124 of the grip 116 to connect the battery pack 20 to the housing 92. Terminals 128 positioned within the grip 116 engage the receptacles 40 to electrically couple the battery pack 20 to the camera assembly 100, the PCB 104, and the display 108.

As shown in FIG. 4, the flexible cable 96 is coupled to a stem 132 extending from the housing 92. The cable 96 supports a plurality of wires to electrically couple the PCB 104 to the camera assembly 100. The illustrated cable 96 is flexible to bend around corners and through pipes, but is also sufficiently rigid to maintain its shape when desired. In the illustrated embodiment, the cable 96 is composed of carbon steel and covered or coated with a polyvinyl chloride (PVC) skin to decrease friction between the cable 96 and the surrounding environment.

The camera assembly 100 is coupled to a distal end of the flexible cable 96 substantially opposite the stem 132. The illustrated camera assembly 100 includes a generally cylindrical camera housing 136, a camera unit or image sensor 140 positioned within the camera housing 136, a light source 144 (e.g., an LED) positioned within the camera housing 136 adjacent to the image sensor 140, and a lens 148 coupled to the camera housing 136 to enclose the image sensor 140 and the light source 144. In the illustrated embodiment, the image sensor 140 is a charge coupled device (CCD), but may alternatively be a complementary metal oxide semiconductor (CMOS). The image sensor 140 is operable to capture an image and/or video of a remote object and transfer image data relating to the remote object to the PCB 104.

As shown in FIG. 5, the PCB 104 is positioned within the support portion 112 of the housing 92 generally behind the display 108. The PCB 104 is populated with a plurality of electrical and electronic components which provide operational control and protection to the inspection device. In some embodiments, the PCB 104 includes a control component or controller such as a microprocessor, a microcontroller, or the like. In some embodiments, the controller includes, for example, a processing unit, a memory, and a bus. The bus connects various components of the controller including the memory to the processing unit. The memory includes, in many instances, read only memory (ROM) and random access memory (RAM). The controller also includes an input/output system that includes routines for transferring information between components within the controller. Software included in the implementation of the inspection device of FIGS. 4 and 5 is stored in the ROM or RAM of the controller. The software includes, for example, firmware applications and other executable instructions. In other embodiments, the controller can include additional, fewer, or different components.

The PCB also includes, for example, a plurality of additional passive and active components such as resistors, capacitors, inductors, integrated circuits, and amplifiers. These components are arranged and connected to provide a plurality of electrical functions to the PCB including, among other things, filtering, signal conditioning, and voltage regulation. For descriptive purposes, a PCB (e.g., PCB 104) and the electrical components populated on the PCB are collectively referred to herein as "the PCB." The PCB 104 receives image data from the image sensor 140, processes or conditions the image data, and transmits the conditioned image data to the display 108. The display 108 receives the conditioned image data and displays an image or video of the remote object for viewing by a user. In the illustrated embodiment, the display 108 is a digital liquid crystal display (DLCD), although other suitable displays may alternatively be employed.

In a manner similar to that described above with respect to the drill 52, the inspection device is operable to communicate with a controller within the battery pack 20, and is operable to shut off or otherwise prevent the battery pack 20 from discharging current when the battery pack 20 is experiencing a low voltage condition, or when the battery pack 20 is in a state-of-charge that is detrimental to the operation of the inspection device or could damage the battery pack 20 if it is further depleted.

The illustrated visual inspection device 88 also includes a plurality of actuators 152 extending from the grip 116 of the housing 92. The actuators 152 are coupled to a PCB 156 to control operation of the device 88. For example, depressing one or more of the actuators 152 may turn the device 88 on and off, zoom in or pan across an image displayed on the display 108, rotate an image displayed on the display 108, adjust the brightness of the light source 144, and/or store an image or a video in an internal or external memory device. In addition, depressing one of the actuators 152 enters a menu mode of the device 88 such that a user may control other functions and settings of the device 88. For example, a user may adjust the time and date, erase or transfer saved images and videos, and/or input text or audio data relating to particular images and videos when in the menu mode. By depressing the appropriate actuator 152, a list of options relating to the various settings of the device 88 is displayed on the display 108. The actuators 152 allow a user to cycle through the various options and menu screens to select one of the options. As such, the inspection device 88 is a menu-driven device. In some embodiments, the inspection device 88 includes one or more LEDs for providing an indication to the user of the status of the inspection device 88, the battery pack 20, or both.

Figure 6:
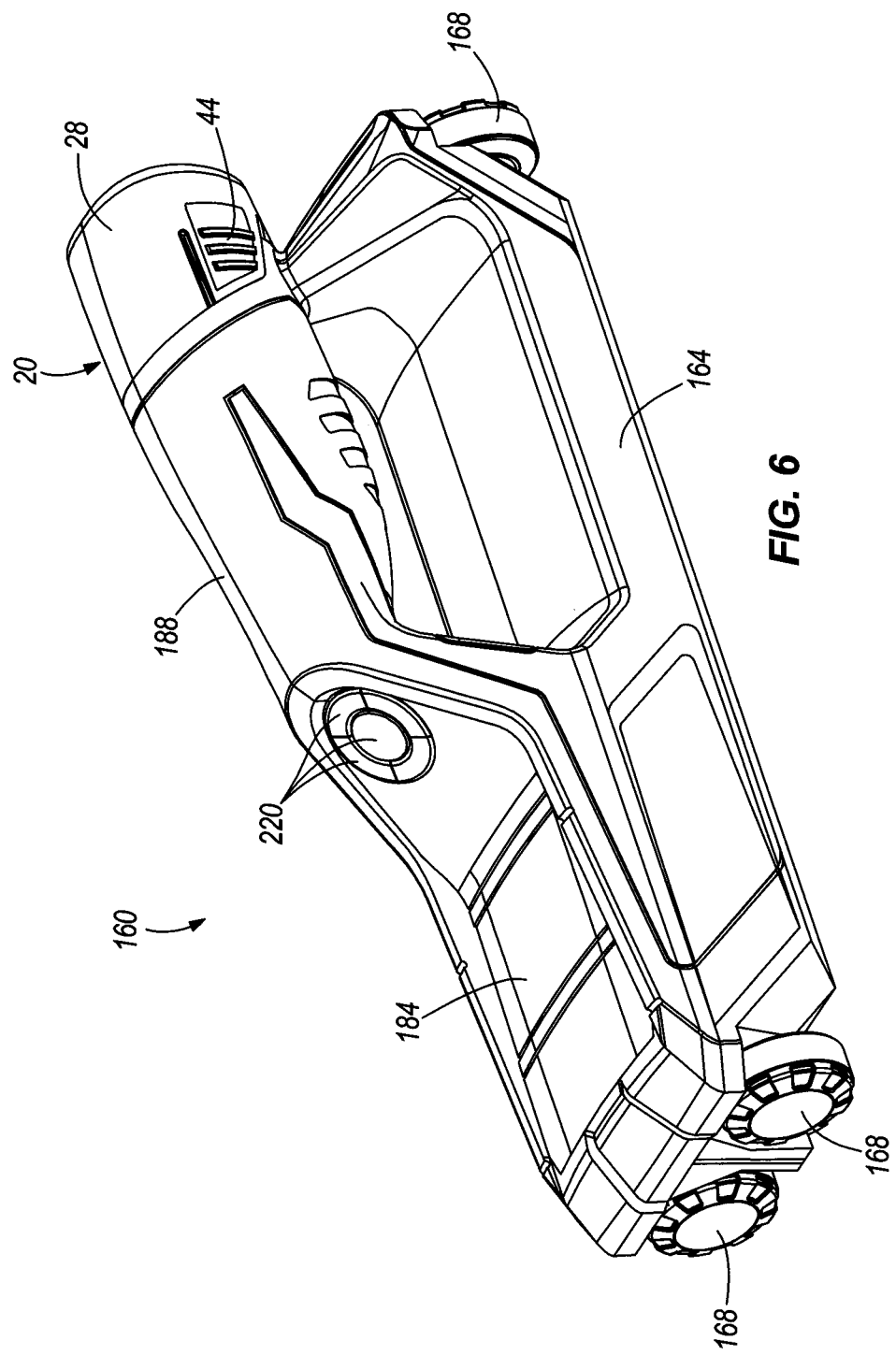
FIG. 6 is a perspective view of a wall scanner for use with the battery pack shown in FIG. 1.
Figure 7:
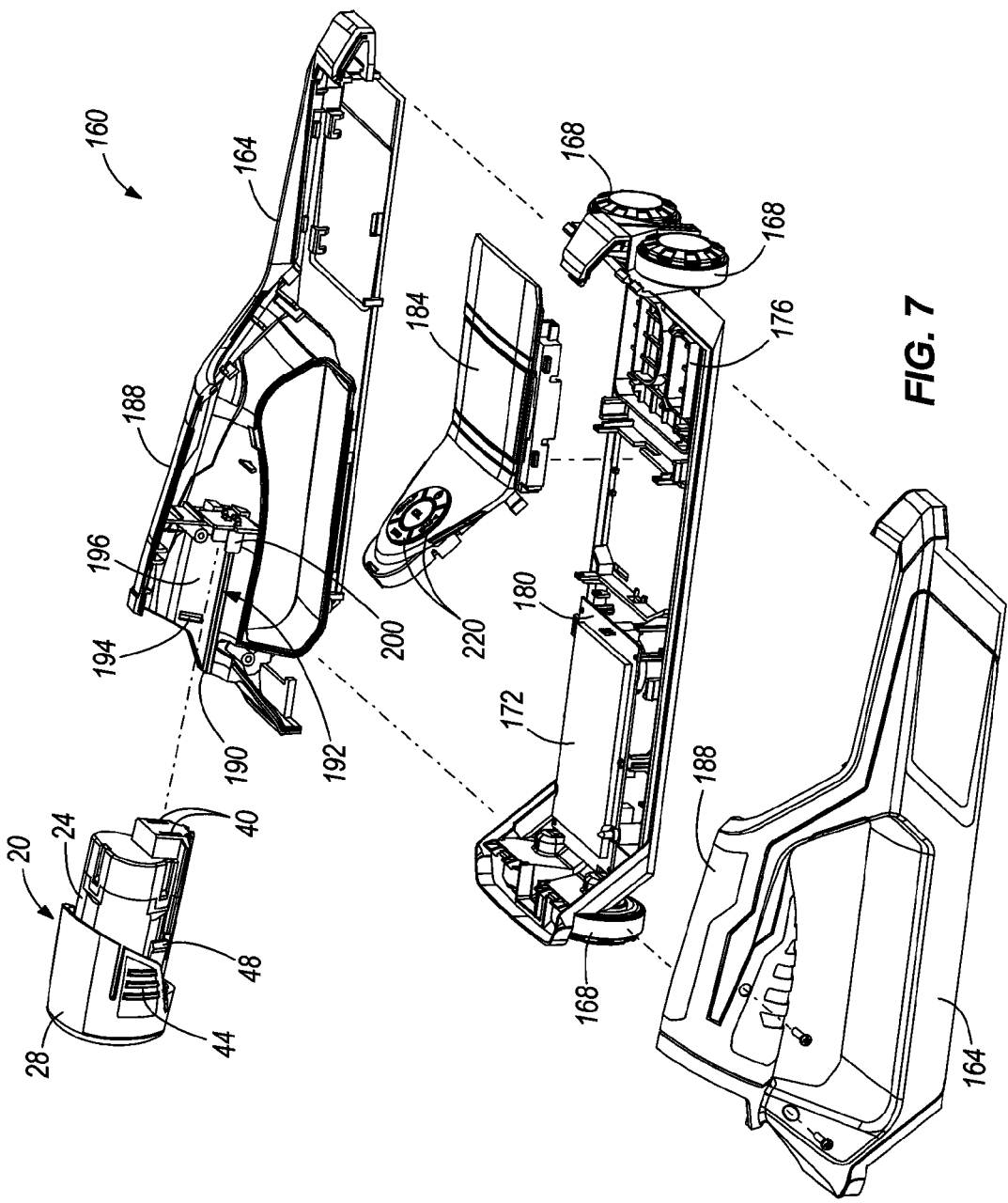
FIG. 7 is an exploded perspective view of the wall scanner shown in FIG. 6.
Figure 8:
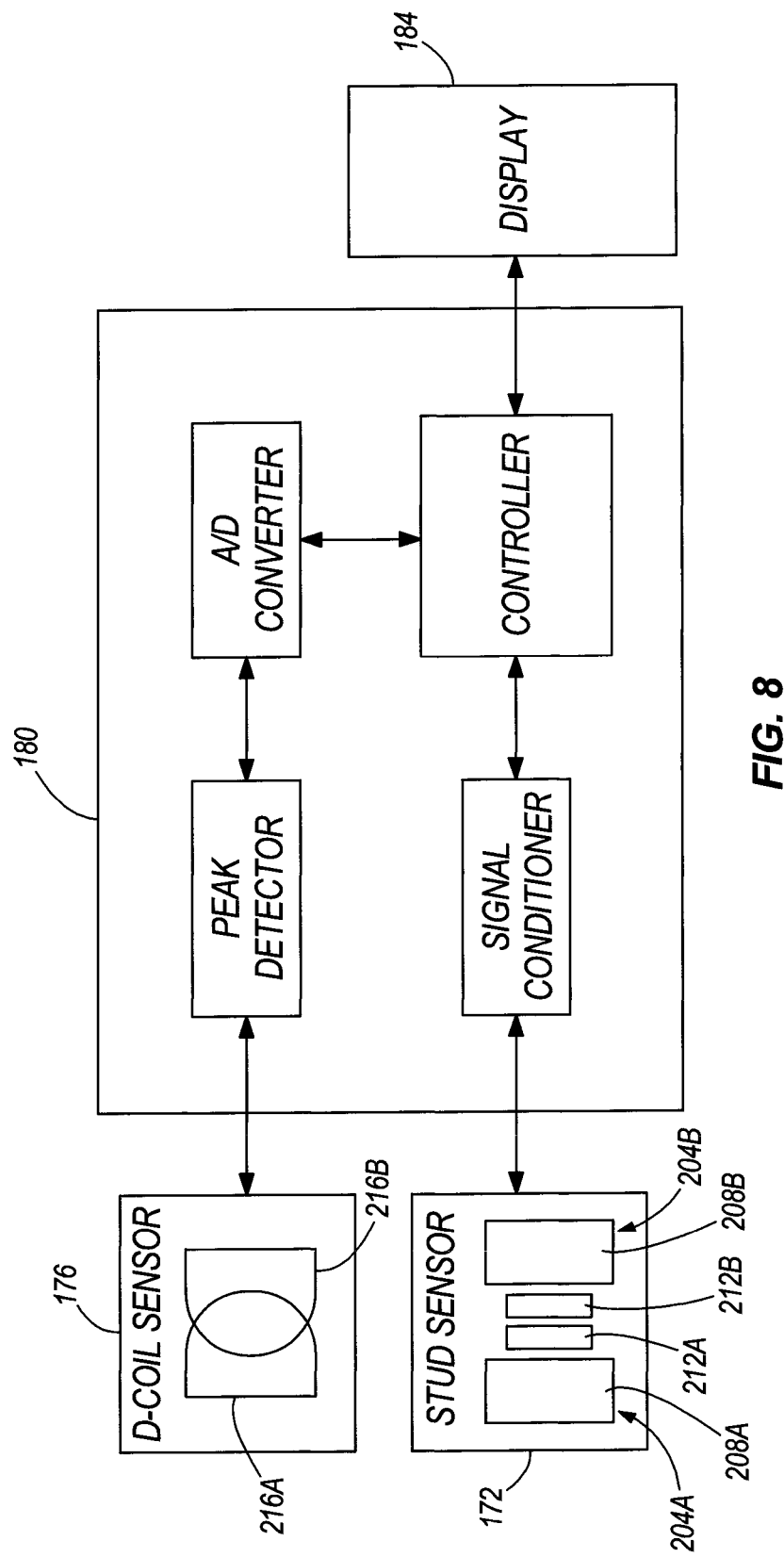
FIG. 8 is a block diagram depicting the wall scanner shown in FIG. 6.

FIGS. 6-8 illustrate another example of a non-motorized sensing tool 160 for use with the battery pack 20. In the illustrated embodiment, the sensing tool 160 is a wall scanner for detecting studs, metallic objects, and live wires behind a wall or other surface.

The illustrated wall scanner 160 includes a housing 164, a plurality of wheels 168 rotatably coupled to the housing 164, a stud sensor 172 and a D-coil sensor 176 positioned substantially within the housing 164, a circuit, such as a PCB 180, positioned substantially within the housing 164, and a display 184 supported by the housing 164. The housing 164 includes a grip 188 extending generally parallel to the display 184 along a centerline of the wall scanner 160. In some embodiments, the wall scanner 160 includes one or more LEDs for providing an indication to the user of the status of the wall scanner 160, the battery pack 20, or both.

The PCB 180 is populated with a plurality of electrical and electronic components in a manner similar to the PCB described above with respect to the inspection device 88. Similar to the tools 52, 88 discussed above, the grip 188 of the wall scanner 160 defines an opening 190 in communication with a cavity 192 to receive the casing 24 of the battery pack 20. As shown in FIG. 7, the tabs 48 of the battery pack 20 engage recesses 194 formed on an inner surface 196 of the grip 188 to connect the battery pack 20 to the housing 164. Terminals 200 positioned within grip 188 engage the receptacles 40 to electrically couple the battery pack 20 to the sensors 172, 176, the PCB 180, and the display 184.

As shown in FIGS. 6 and 7, the wheels 168 are rotatably coupled to the housing 164 to facilitate movement of the wall scanner 160 along a surface. In the illustrated embodiment, the wheels 168 are idle wheels, but may alternatively be driven wheels that are powered by the battery pack 20.

Referring to FIG. 8, the stud sensor 172 is electrically coupled to the PCB 180 and is operable to detect the presence of a stud, such as a wood stud or metal joist, behind a surface (e.g., a wall, a floor, a ceiling, etc.) of a residential, commercial, or industrial structure. The stud sensor 172 detects wooden studs or metal joists hidden behind surfaces composed of, for example, plaster, non-metallic wall materials, wooden panels, wall board, or the like. The illustrated stud sensor 172 includes two sensors 204A, 204B, each having a coplanar primary plate 208A, 208B with a single side coplanar plate 212A, 212B arranged between the primary plates 208A, 208B. When the stud sensor 172 detects a stud, the sensor 172 outputs a signal to the PCB 180 indicating the leading and trailing edges of the stud and, in some embodiments, the material of the stud.

The D-coil sensor 176 is also electrically coupled to the PCB 180 and is operable to detect both ferrous (i.e., iron based) and non-ferrous (e.g., copper) metals within structures. The D-coil sensor 176 detects, for example, rebar, metal conduit, and copper piping behind surfaces composed of wall board, tile, plaster, brick, or the like. The D-coil sensor 176 may also detect metal within walls composed of concrete, masonry, wood, brick, or the like. The illustrated D-coil sensor 176 uses an inductively coupled sensor that includes overlapping D-shaped transmitter and receiver coils 216A, 216B. When the D-coil sensor 176 detects a metallic object, the sensor 176 outputs a signal to the PCB 180 indicating the location of the object.

In some embodiments, the wall scanner 160 may also include an AC detection circuit for detecting the presence of live wires carrying alternating currents hidden behind a surface. In such embodiments, the wall scanner 160 may include an LED or other indicator for notifying a user when AC carrying wires are detected. The LED may be located on an end of the housing 164 substantially opposite the battery pack 20, on the display 184, or both. The AC detection circuit may be operable to detect the presence of AC currents regardless of the operational mode (e.g., stud sensing mode or metal sensing mode) of the wall scanner 160.

As shown in FIG. 7, the PCB 180 is positioned within the housing 164 adjacent to the stud sensor 172 and the D-coil sensor 176. The PCB 180 receives signals from the sensors 172, 176, processes or conditions the signals, and transmits the conditioned signals to the display 184. The display 184 receives the conditioned signals and displays an image, a value (e.g., a distance, coordinates, etc.), or an alert relating to the detected object. In the illustrated embodiment, the display 184 is a LCD, such as a negative LCD, although other suitable displays may alternatively be employed.

In a manner similar to that described above with respect to the drill 52, the wall scanner 160 is operable to communicate with a controller within the battery pack 20, and is operable to shut off or otherwise prevent the battery pack from discharging current when the battery pack is experiencing a low voltage condition, or when the battery pack is in a state-of-charge that is detrimental to the operation of the wall scanner or could damage the battery pack if it is further depleted.

As shown in FIG. 6, the wall scanner 160 also includes a plurality of actuators 220 extending through the housing 164 adjacent to the grip 188 and the display 184. The actuators 220 are electrically coupled to the PCB 180 to control operation of the PCB 180 and the sensors 172, 176. For example, depressing one of the actuators 220 can turn the wall scanner 160 on and off, alternate between using the stud sensor 172 (i.e., the stud sensing mode) and the D-coil sensor 176 (i.e., the metal sensing mode), and/or enter a menu mode of the scanner 160. When in the menu mode, a list of options relating to various settings of the scanner 160 is displayed on the display 184. The actuators 220 allow a user to cycle through the various options and menu screens to select one of the options. As such, the wall scanner 160 is a menu-driven device.

As a result of the wall scanner 160 receiving operational power from the battery pack 20, the wall scanner 160 is capable of including a variety of additional features or functions that increase its power demand. For example, the wall scanner 160 can include a high-intensity LED flashlight, a backlighted control section or actuators, a high-resolution LCD, a color LCD, and/or an additional or remote display. Conventionally powered wall scanners (e.g., wall scanners powered by alkaline batteries) are either unable to provide the required voltage and current to power these additional features, or the operational runtime (i.e., the amount of time for which the batteries can power the wall scanner before the batteries need to be replaced or recharged) of the alkaline batteries is shortened. In contrast, the battery pack 20 is capable of powering both the additional features of the wall scanner 160 and the sensing and display features described above, while maintaining an operational runtime that is comparable to or longer than a conventional wall scanner that does not include additional features.

Figure 9:
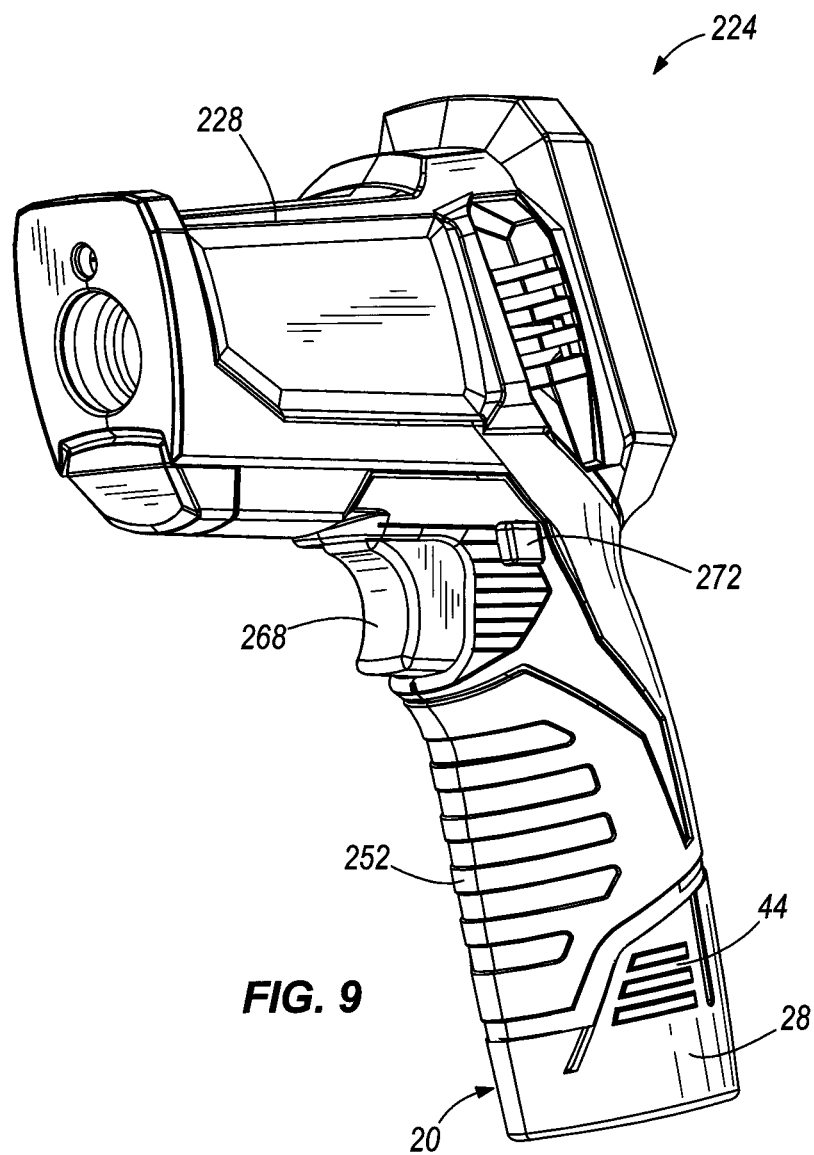
FIG. 9 is a perspective view of a thermometer for use with the battery pack shown in FIG. 1.
Figure 10:
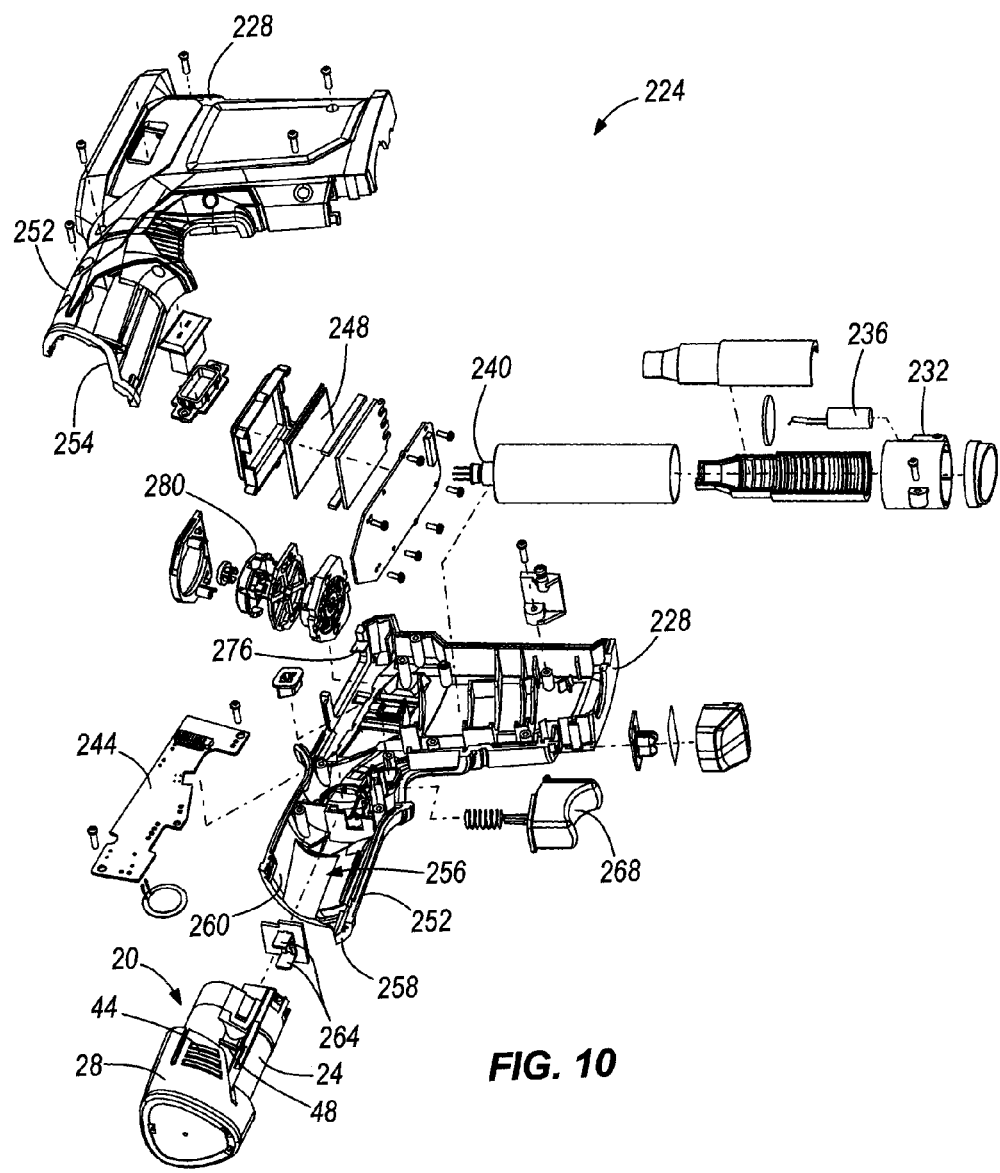
FIG. 10 is an exploded perspective view of the thermometer shown in FIG. 9.

FIGS. 9-10 illustrate yet another example of a non-motorized sensing tool 224 for use with the battery pack 20. In the illustrated embodiment, the sensing tool 224 is an infrared (IR) thermometer capable of detecting a temperature of a distant object or surface. The IR thermometer 224 allows a user to measure the temperature while either spaced away from an object or directly contacting the object with the thermometer 224.

The illustrated thermometer 224 includes a housing 228, an infrared (IR) temperature sensor 232 positioned within the housing 228, a laser 236 positioned within the housing 228 adjacent to the IR temperature sensor 232, a thermocouple 240 positioned within the housing 228, a circuit, such as a PCB 244 (FIG. 10), positioned within the housing 228, and a display 248 (FIG. 10) supported by the housing 228. The housing 228 includes a grip 252 extending generally parallel relative to the display 248. The PCB 244 is populated with a plurality of electrical and electronic components in a manner similar to the PCB described above with respect to the inspection device 88 and the wall scanner 160. Similar to the tools 52, 88, 160 discussed above, the grip 252 of the thermometer 224 defines an opening 254 in communication with a cavity 256 to receive the casing 24 of the battery pack 20. As shown in FIG. 10, the tabs 48 of the battery pack 20 engage recesses 258 formed on an inner surface 260 of the grip 252 to connect the battery pack 20 to the housing 228. Terminals 264 positioned within the grip 252 engage the receptacles 40 (FIGS. 1 and 2A) to electrically couple the battery pack 20 to the temperature sensor 232, the laser 236, the thermocouple 240, the PCB 244, and the display 248.

As shown in FIGS. 9 and 10, the illustrated grip 252 also supports a trigger 268 to control operation of the IR temperature sensor 232, the laser 236, and/or the thermocouple 240. In some embodiments, such as the illustrated embodiment, the trigger 268 includes a lock 272 for taking continuous temperature measurements with one of the sensors 232, 240. In some embodiments, the IR thermometer 224 includes one or more LEDs for providing an indication to the user of the status of the IR thermometer 224, the battery pack 20, or both.

Referring to FIG. 10, the IR temperature sensor 232 includes a lens and a detector. The lens focuses infrared energy onto the detector, which then converts the energy into a signal that is transmitted to the PCB 244. The IR temperature sensor 232 also has an associated distance-to-spot ratio (D:S). The D:S ratio is a ratio of a distance to an object and a diameter of a temperature measurement area. For example, if the D:S is 20:1, the IR temperature sensor 232 averages the temperature of an object twenty feet away over an area with a one-foot diameter. In some embodiments, the IR temperature sensor 232 includes settings for measuring the temperature of both reflective and non-reflective surfaces.

The thermocouple 240 is electrically coupled to the PCB 244 to provide a signal indicative of a contact temperature measurement. In the illustrated embodiment, the thermocouple 240 is a K-type thermocouple, although other suitable thermocouples may alternatively be employed. The thermocouple 240 may be used independently of the IR temperature sensor 232 or in conjunction with the IR temperature sensor 232 to, for example, provide both contact and non-contact temperature measurements of an object.

In the illustrated embodiment, the thermometer 224 also includes a humidity sensor 276 positioned within the housing 228 and electrically coupled to the PCB 244. The humidity sensor 276 provides a signal to the PCB 244 that is indicative of the humidity in the environment surrounding the thermometer 224. As such, the humidity sensor 276 is used for calibrating the IR temperature sensor 232 and for adjusting measurements made using the IR temperature sensor 232.

The illustrated PCB 244 is positioned within the grip 252 of the housing 228. The PCB 244 receives signals from the sensors 232, 240, 276, processes or conditions the signals, and transmits the conditioned signals to the display 248. The display 248 receives the conditioned signals and displays one or more values relating to the measured temperatures. In addition, the display 248 also displays a value relating to the measured humidity. In the illustrated embodiment, the display 248 is a LCD, such as a negative LCD, although other suitable displays may alternatively be employed.

In a manner similar to that described above with respect to the drill 52, the IR thermometer 224 is operable to communicate with a controller within the battery pack 20, and is operable to shut off or otherwise prevent the battery pack 20 from discharging current when the battery pack 20 is experiencing a low voltage condition, or when the battery pack 20 is in a state-of-charge that is detrimental to the operation of the IR thermometer or could damage the battery pack 20 if it is further depleted.

As a result of the wall scanner receiving operational power from the battery pack 20, the IR thermometer 224 is capable of including a variety of additional features or functions that increase its power demand. For example, the IR thermometer 224 can include a high-intensity LED flashlight, a backlighted control section or actuators, a high-resolution LCD, a color LCD, and/or an additional or remote display. Conventionally powered thermometers (e.g., thermometers powered by alkaline batteries) are either unable to provide the required voltage and current to power these additional features, or the operational runtime (i.e., the amount of time for which the batteries can power the thermometer before the batteries need to be replaced or recharged) of the alkaline batteries is shortened. In contrast, the battery pack 20 is capable of powering both the additional features of the IR thermometer 224 and the sensing and display features described above, while maintaining an operational runtime that is comparable to or longer than a conventional thermometer that does not include additional features.

As shown in FIG. 10, the thermometer 224 also includes a plurality of actuators 280 that extend through the housing 228 adjacent to the grip 252 and the display 248. The actuators 280 are electrically coupled to the PCB 244 to control operation of the PCB 244 and the sensors 232, 240, 276. For example, depressing one of the actuators 280 can turn the thermometer 224 on and off, alternate between non-contact and contact measurement modes, and/or enter a menu mode of the thermometer 224. When in the menu mode, a list of options relating to various settings of the thermometer 224 is displayed on the display 248. The actuators 280 allow a user to cycle through the various options and menu screens to select one of the options. As such, the thermometer 224 is a menu-driven device.

Figures 11, 12:
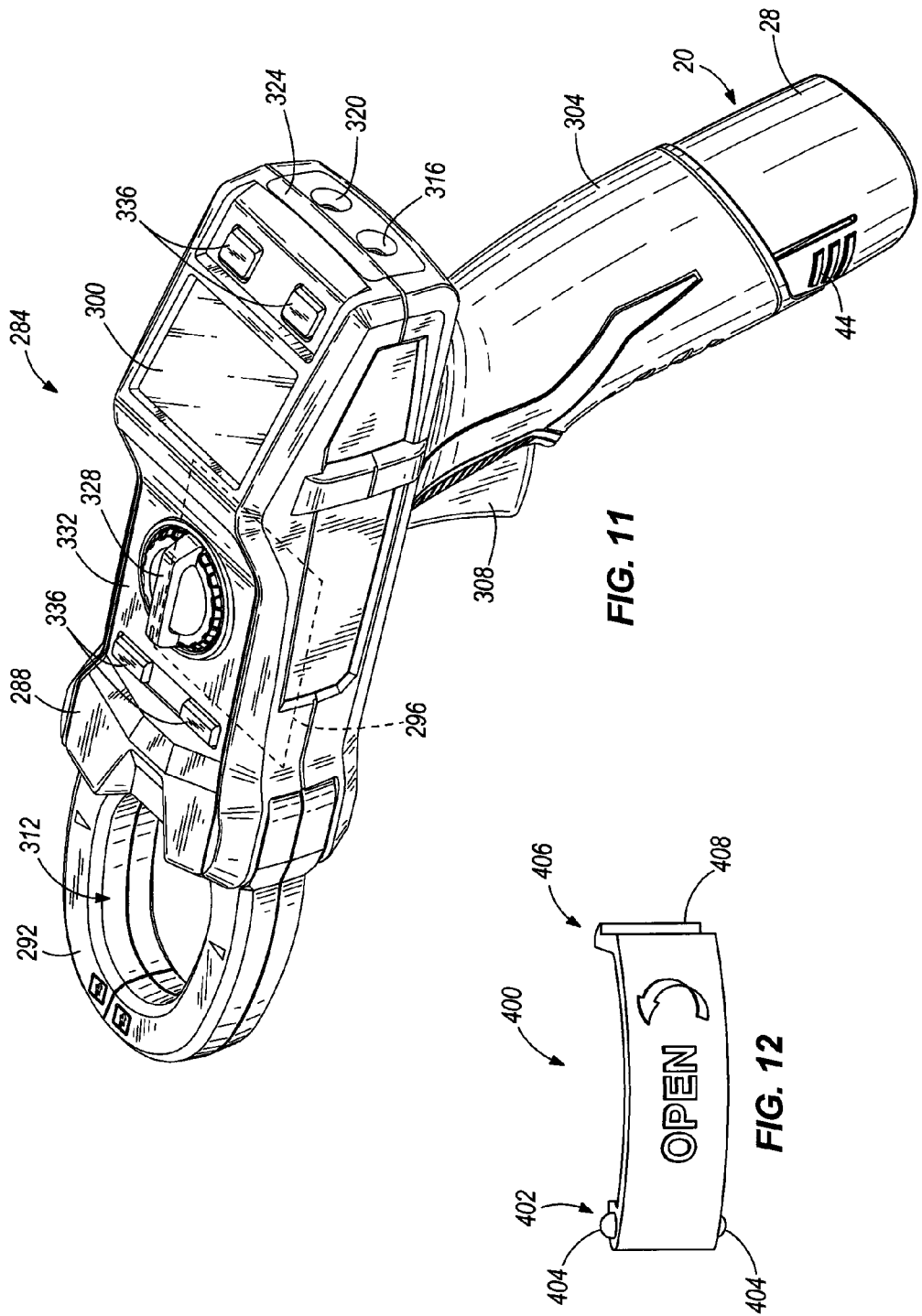
FIG. 11 is a perspective view of a clamp meter for use with the battery pack shown in FIG. 1.
FIG. 12 is a perspective view of a secondary battery lock for use with the clamp meter shown in FIG. 11.

FIG. 11 illustrates still another example of a non-motorized sensing tool 284 for use with the battery pack 20. In the illustrated embodiment, the sensing tool 284 is a clamp meter for measuring various properties or characteristics of a circuit element (e.g., a wire, a resistor, a capacitor, etc.) or other conductive object. The clamp meter 284 allows a user to measure, for example, the electrical current flowing through the circuit element without disconnecting the element from the corresponding circuit.

The illustrated clamp meter 284 includes a housing 288, a clamp 292 coupled to an end portion of the housing 288, a circuit, such as a PCB 296, positioned substantially within the housing 288, and a display 300 supported by the housing 288. The housing 288 includes a grip 304 extending generally perpendicular relative to the PCB 296 and the display 300. In some embodiments, the clamp meter 284 includes one or more LEDs for providing an indication to the user of the status of the clamp meter 284, the battery pack 20, or both. The PCB 296 is populated with a plurality of electrical and electronic components in a manner similar to the PCB described above with respect to the inspection device 88, the wall scanner 160, and the IR thermometer 224. Similar to the tools 52, 88, 160, 224 discussed above, the grip 304 of the clamp meter 284 defines an opening to receive the casing 24 (FIGS. 1 and 2A) of the battery pack 20. The tabs 48 (FIGS. 1 and 2) of the battery pack 20 engage recesses formed on an inner surface of the grip 304 to connect the battery pack 20 to the housing 288. Terminals positioned within the grip 304 engage the receptacles 40 (FIGS. 1 and 2A) of the battery pack 20 to electrically couple the clamp 292, the PCB 296, and the display 300 to the battery pack 20.

As shown in FIG. 11, the grip 304 also supports a trigger 308 for actuating (e.g., opening and closing) the clamp 292. The trigger 308 is coupled to, for example, a geared mechanical actuator that opens the clamp 292 when the trigger 308 is depressed and closes the clamp 292 when the trigger 308 is released. In other embodiments, the clamp 292 may be opened and closed electronically when the trigger 308 is depressed and released.

The illustrated clamp 292 extends outwardly from the end portion of the housing 288 generally perpendicular to the grip 304. The clamp 292 supports and encloses a magnetic core for measuring current flowing through an object (e.g., a wire). When the clamp 292 is opened, the wire is positioned within an opening 312 defined by the clamp 292 such that the magnetic core substantially surrounds the wire. Once the clamp 292 closes, the magnetic core begins measuring current flowing through the wire and outputs a signal indicative of the measured current to the PCB 296.

The PCB 296 receives the signal from the clamp 292, processes or conditions the signal, and outputs the conditioned signal to the display 300. The display 300 receives the conditioned signal and displays a value (e.g., a number) corresponding to the measured current. In the illustrated embodiment, the display 300 is an LCD, such as a negative LCD, but may alternatively be another suitable type of display.

In a manner similar to that described above with respect to the drill 52, the clamp meter 284 is operable to communicate with a controller within the battery pack 20, and is operable to shut off or otherwise prevent the battery pack 20 from discharging current when the battery pack 20 is experiencing a low voltage condition, or when the battery pack 20 is in a state-of-charge that is detrimental to the operation of the clamp meter or could damage the battery pack 20 if it is further depleted.

In some embodiments, devices herein include a secondary or redundant locking mechanism or lockable structure which prevents a user from easily removing the battery pack. Accordingly, in some embodiments, the clamp meter 284 includes a secondary battery lock 400, as shown in FIG. 12. The secondary battery lock 400 works in conjunction with the actuators 44 and tabs 48 of the battery pack 20, and is operable to redundantly secure the battery pack to the clamp meter 284. In the illustrated embodiment, the secondary battery lock 400 includes a first end 402 having ball joints 404 for pivotably coupling the secondary battery lock 400 to the housing 288 of the clamp meter 284. The secondary battery lock 400 includes a second end 406 having a flange 408 for mating with a rib, groove, spine, etc. of the battery pack 20. The secondary battery lock 400 is positioned within an aperture (not shown) of the housing 288 at a lower portion of the grip 304, and is configured such that it is only releasable using a separate tool, such as a flat-headed screwdriver or a knife. In other words, the secondary battery lock 400 must be consciously opened or brought out of engagement with the battery pack 20 before the battery pack 20 can be removed.

As a result of the clamp meter 284 receiving operational power from the battery pack 20, the clamp meter 284 is capable of including a variety of additional features or functions that increase its power demand. For example, the clamp meter 284 can include a high-intensity LED flashlight, a backlighted control section or actuators, a high-resolution LCD, a color LCD, and/or an additional or remote display. Conventionally powered clamp meters (e.g., clamp meters powered by alkaline batteries) are either unable to provide the required voltage and current to power these additional features, or the operational runtime (i.e., the amount of time for which the batteries can power the clamp meter before the batteries need to be replaced or recharged) of the alkaline batteries is shortened. In contrast, the battery pack 20 is capable of powering both the additional features of the clamp meter 284 and the sensing and display features described above, while maintaining an operational runtime that is comparable to or longer than a conventional clamp meter that does not include additional features.

In the illustrated embodiment, the clamp meter 284 also includes positive and negative terminals 316, 320 positioned on a rear surface 324 of the housing 288 substantially opposite the clamp 292. The terminals 316, 320 are operable to receive electrical leads for probes, allowing a user to test other electrical characteristics or properties of a circuit. For example, the terminals 316, 320 may help measure AC and DC current, AC and DC voltages, resistance, and capacitance of various circuit elements. The terminals 316, 320 output signals indicative of the measured characteristics to the PCB 296 for displaying on the display 300.

As shown in FIG. 11, the clamp meter 284 further includes a dial 328 supported on an upper surface 332 of the housing 288. The dial 328 is electrically coupled to the PCB 296 to change the operating mode of the clamp meter 292. That is, actuating (e.g., rotating) the dial 328 adjusts the clamp meter 292 to measure an output, for example, AC or DC current, AC or DC voltage, capacitance, and/or resistance of an object. In addition, one position of the dial 328 is an off position to interrupt power flowing from the battery pack 20 to the clamp meter 284.

In the illustrated embodiment, the clamp meter 284 also includes a plurality of functional buttons 336 to perform other functions with and adjust settings of the clamp meter 284. For example, one functional button 336 may be actuated to zero the clamp meter 284, one functional button 336 may be actuated to change the units of a displayed value, one functional button 336 may be actuated to temporarily hold or save a displayed value, one functional button 336 may be actuated to display minimum and maximum measured values, and one functional button 336 may be actuated to display only a peak or inrush value.

Accordingly, the battery pack 20 is usable with both power tools (e.g., the drill 52) and non-motorized sensing tools (e.g., the visual inspection device 88, the wall scanner 160, the thermometer 224, and the clamp meter 284). Typically, a battery pack that is used with a power tool is too heavy and bulky for use with non-motorized, software-driven tools. However, lithium-ion battery packs enable the use of high-voltage removable and rechargeable battery packs with these non-motorized sensing tools. The illustrated battery pack 20 includes battery cells 32 having a lithium-based chemistry such that the battery pack 20 is over 65% lighter and 50% smaller than an equivalent nickel-cadmium (NiCd) battery pack. The lithium-ion battery pack 20 also provides a longer operational run-time for each tool, and a longer life (e.g., number of recharge cycles) than the other non-lithium based battery packs.

Additionally, as described above, the battery pack 20 is also capable of providing operational power to a plurality of additional features or functions of the inspection device, the wall scanner, the IR thermometer, and the clamp meter. For example, the additional functions or features can include a high-intensity LED flashlight, a backlighted control section or actuators, a high-resolution LCD, a color LCD, and/or an additional or remote display.

In addition, the illustrated battery pack 20 is designed to partially fit within a grip of a tool such that the battery pack 20 does not greatly increase the overall size of the tool. In particular, the outer housing 28 of the battery pack 20 functions as both a grip for the tool and a cover for battery terminals of the tool when the battery pack 20 is inserted into an opening or cavity formed in the tool.

Furthermore, providing a battery pack that is usable with a variety of tools (i.e., motorized power tools and non-motorized sensing tools) allows a user to only purchase and/or keep one or a few battery packs on hand. For example, a user can purchase a variety of tools, such as those shown in FIG. 13, in a single kit that includes one or more battery packs 20 and a single charger. The user is not required to purchase additional battery chargers for charging different types of batteries, and the user is not required to purchase replacement batteries such as is required for devices which operate on alkaline batteries. In addition and because each tool can be operated by a single type of battery pack, the flexibility and usability of the system of tools is maximized. As an illustrative example, a user can use a first non-motorized sensing device, such as the IR thermometer 224, to detect the temperature of an electrical utility box. The user can then access the utility box using a motorized power tool, such as the drill 52. After accessing the electrical utility box, the user can detect the amount of current flowing through a wire using a second non-motorized sensing device, such as the clamp meter 284. In the described example, the IR thermometer, the drill, and the clamp meter can be operated using a single removable and rechargeable battery pack 20. The user can simply interchange the battery pack from tool to tool as needed.

In another embodiment, the user can use a first non-motorized sensing device, such as the wall scanner 160, to detect the presence of an object (e.g., a stud, electrical conduit, etc.) hidden behind a surface. The user can then remove a small portion of the surface using a motorized power tool, such as a reciprocating saw 424 (shown in FIG. 13), to gain access to the area behind the surface. After accessing the area behind the surface, the user can inspect the area using a second non-motorized sensing device, such as the inspection device 88.

In yet another embodiment, the user can use a first motorized power tool, such as the drill 52, to gain access to a secured electrical control box (e.g., a circuit breaker box). The user can then test various circuits and wires for voltages, currents, continuity, etc. using a non-motorized sensing tool, such as the clamp meter 284. After testing is complete, the user can label, for example, wires, circuit breakers, or the control box using a second motorized tool, such as a label maker.

Additionally or alternatively, if the battery pack of a power tool is low on power, the user can remove the battery pack from a non-motorized tool that he/she is not using and connect the battery pack to the power tool, or vice versa. Using one type of battery pack for a variety of tools also only requires the user to keep one battery charger on hand for charging the battery packs.

Figure 13:
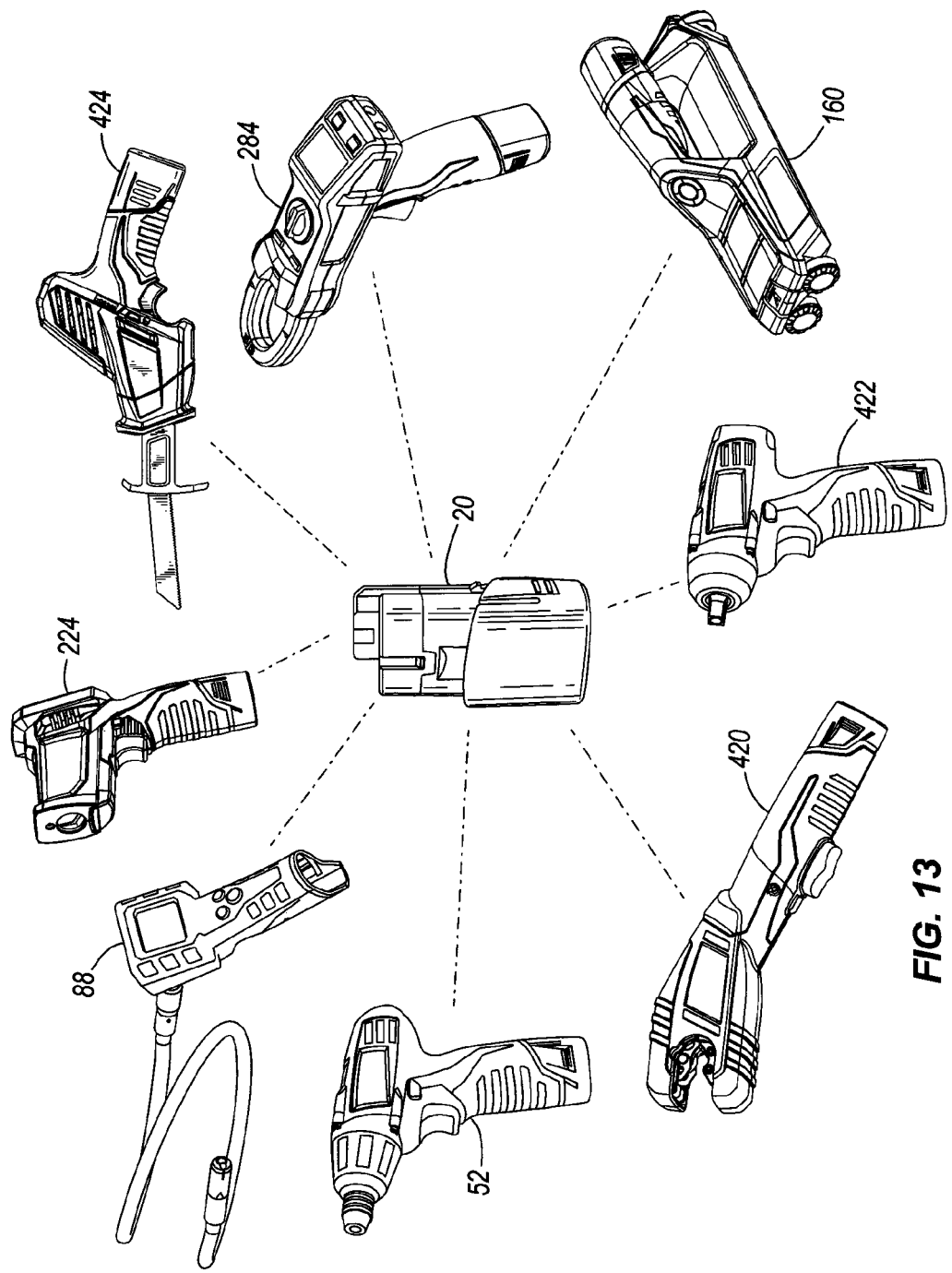
FIG. 13 illustrates a battery pack for use with a variety of tools.

FIG. 13 illustrates the compatibility of the battery pack 20 with a variety of tools. For example, the battery pack 20 is compatible with the drill 52, the inspection device 88, the clamp meter 284, the IR thermometer 224, the wall scanner 160, a pipe cutter 420, an impact driver 422, and a reciprocating saw 424.

Although the invention has been described in detail with reference to preferred embodiments, variations and modifications exist within the scope and spirit of one or more independent aspects of the invention as described. Various features and advantages of the invention are set forth in the following claims.

What is claimed is:

1. A system comprising:
   a power tool including a housing, a motor, a drive mechanism mechanically coupled to the motor, and an output element mechanically coupled to the drive mechanism, the housing defining an opening, the motor operable to drive the drive mechanism and the output element, the output element producing an output force when driven by the drive mechanism;
   a non-motorized sensing tool including a housing, a printed circuit board and a sensing element electrically coupled to the printed circuit board, the housing defining an opening that is similarly shaped and sized relative to the opening defined in the housing of the power tool, the sensing element operable to detect a characteristic external to the sensing tool and output a signal indicative of the detected characteristic to the printed circuit board, the printed circuit board operable to condition the signal; and
   a rechargeable battery pack removably and independently coupled to the power tool and the non-motorized sensing tool, the battery pack operable to provide power to the motor to drive the drive mechanism and the output element when connected to the power tool, and operable to provide power to the printed circuit board when connected to the non-motorized sensing tool, at least a portion of the battery pack being positioned within the opening of the power tool to connect to the power tool and alternatively being positioned within the opening of the non-motorized sensing tool to connect to the non-motorized sensing tool,
   wherein the rechargeable battery pack includes a housing, at least one lithium-ion battery cell positioned within the housing, a terminal electrically coupled to the battery cell, a sense terminal, and a latch mechanism,
   wherein, when the battery pack is coupled to the power tool, the latch mechanism engages the housing of the power tool to secure the battery pack to the power tool such that a portion of the battery pack housing remains exposed, and
   wherein, when the battery pack is coupled to the non-motorized sensing tool, the latch mechanism engages the housing of the non-motorized sensing tool to secure the battery pack to the non-motorized sensing tool such that the portion of the battery pack housing remains exposed.

2. The system of claim 1, wherein the non-motorized sensing tool includes a display electrically coupled to the printed circuit board, and wherein the display receives the conditioned signal from the printed circuit board and displays an indication of the characteristic external to the sensing tool.

3. The system of claim 1, wherein the non-motorized sensing tool is a menu-driven device having a plurality of settings, and wherein the non-motorized sensing tool includes a selector to adjust at least one of the plurality of settings.

4. The system of claim 1, wherein the non-motorized sensing tool includes a visual inspection device and the sensing element includes an image sensor, and wherein the image sensor is operable to transmit image data of a remote object to the printed circuit board.

5. The system of claim 1, wherein the non-motorized sensing tool includes a wall scanner and the sensing element includes a stud sensor operable to detect a stud behind a surface and transmit a first signal indicative of the stud to the printed circuit board.

6. The system of claim 1, wherein the non-motorized sensing tool includes a thermometer and the sensing element includes an infrared temperature sensor, and wherein the infrared temperature sensor is operable to sense a temperature of an object and transmit a signal indicative of the sensed temperature to the printed circuit board.

7. The system of claim 1, wherein the non-motorized sensing tool includes a clamp meter and the sensing element includes a current clamp, and wherein the current clamp is operable to measure electrical current in an object and transmit a signal indicative of the measured electrical current to the printed circuit board.

8. The system of claim 1, wherein the power tool includes a drill.

9. The system of claim 1, wherein the power tool includes a reciprocating saw.

10. The system of claim 1, wherein the power tool includes a circular saw.

11. The system of claim 1, wherein the power tool includes a pipe cutter.

12. The system of claim 1, wherein the power tool includes an impact driver.

13. The system of claim 1, wherein the power tool communicatively connects to the battery pack via the sense terminal.

14. The system of claim 13, wherein the power tool is configured to receive information from the battery pack via the sense terminal.

15. The system of claim 14, wherein the information includes a state-of-charge associated with the battery pack.

16. The system of claim 15, wherein the state-of-charge is a state-of-charge associated with the at least one lithium-ion battery cell.

17. The system of claim 1, wherein the sensing tool communicatively connects to the battery pack via the sense terminal.

18. The system of claim 17, wherein the sensing tool is configured to receive information from the battery pack via the sense terminal.

19. The system of claim 18, wherein the information includes a state-of-charge associated with the battery pack.

20. The system of claim 19, wherein the state-of-charge is a state-of-charge associated with the at least one lithium-ion battery cell.

21. A system comprising:
a power tool including
a first housing defining a first opening,
a motor positioned substantially within the first housing,
a drive mechanism mechanically coupled to the motor, the motor operable to drive the drive mechanism, and
a first battery terminal supported by the first housing and positioned within the first opening;
a non-motorized sensing tool including
a second housing defining a second opening, the second opening being similarly shaped and sized relative to the first opening,
a printed circuit board positioned substantially within the second housing,
a sensing element electrically coupled to the printed circuit board, the sensing element operable to detect a characteristic external to the sensing tool and output a signal indicative of the detected characteristic to the printed circuit board, the printed circuit board operable to condition the signal, and
a second battery terminal supported by the second housing and positioned within the second opening; and
a rechargeable battery pack removably and independently coupled to the power tool and the non-motorized sensing tool, a portion of the battery pack being insertable into the first opening of the power tool to engage the first battery terminal and substantially enclose the first opening, the portion of the battery pack being insertable into the second opening of the non-motorized sensing tool to engage the second battery terminal and substantially enclose the second opening, the first battery terminal and the second battery terminal being generally exposed when the portion of the battery pack is removed from the first opening and the second opening, respectively,
wherein the rechargeable battery pack includes a housing, at least one lithium-ion battery cell positioned within the housing, a terminal electrically coupled to the battery cell, and a latch mechanism,
wherein, when the battery pack is coupled to the power tool, the latch mechanism engages the first housing to secure the battery pack to the power tool such that a portion of the battery pack housing remains exposed, and
wherein, when the battery pack is coupled to the non-motorized sensing tool, the latch mechanism engages the second housing to secure the battery pack to the non-motorized sensing tool such that the portion of the battery pack housing remains exposed.

22. The system of claim 21, wherein the non-motorized sensing tool includes a visual inspection device and the sensing element includes an image sensor.

23. The system of claim 21, wherein the non-motorized sensing tool includes a wall scanner and the sensing element includes a stud sensor, the stud sensor is operable to detect a stud behind a surface and transmit a first signal indicative of the stud to the printed circuit board.

24. The system of claim 21, wherein the non-motorized sensing tool includes a thermometer and the sensing element includes an infrared temperature sensor, and wherein the infrared temperature sensor is operable to sense a temperature of an object and transmit a signal indicative of the sensed temperature to the printed circuit board.

25. The system of claim 21, wherein the non-motorized sensing tool includes a clamp meter and the sensing element includes a current clamp, and wherein the current clamp is operable to measure electrical current in an object and transmit a signal indicative of the measured electrical current to the printed circuit board.

26. The system of claim 21, wherein the power tool includes a drill.

27. The system of claim 21, wherein the power tool includes a reciprocating saw.

28. The system of claim 21, wherein the power tool includes a circular saw.

29. The system of claim 21, wherein the power tool includes a pipe cutter.

30. The system of claim 21, wherein the power tool includes an impact driver.

31. A system comprising:
a power tool including a housing, a motor, a drive mechanism mechanically coupled to the motor, and an output element mechanically coupled to the drive mechanism, the housing defining an opening, the motor operable to drive the drive mechanism and the output element, the output element producing an output force when driven by the drive mechanism;
a non-motorized sensing tool including a housing, a printed circuit board and a sensing element electrically coupled to the printed circuit board, the housing defining an opening that is similarly shaped and sized relative to the opening defined in the housing of the power tool, the sensing element operable to detect a characteristic external to the sensing tool and output a signal indicative of the detected characteristic to the printed circuit board, the printed circuit board operable to condition the signal; and
a rechargeable battery pack removably and independently coupled to the power tool and the non-motorized sensing tool, the battery pack operable to power the motor to drive the drive mechanism and the output element when connected to the power tool, and operable to power the printed circuit board and the sensing element when connected to the non-motorized sensing tool, at least a portion of the battery pack being positioned within the opening of the power tool to connect to the power tool and alternatively being positioned within the opening of the non-motorized sensing tool to connect to the non-motorized sensing tool,
wherein the power tool is selected from the group consisting of a drill, a reciprocating saw, a circular saw, a pipe cutter, and an impact driver.

32. The system of claim 31, wherein the non-motorized sensing tool includes a display electrically coupled to the printed circuit board, and wherein the display receives the conditioned signal from the printed circuit board and generates and indication of the characteristic external to the sensing tool.

33. The system of claim 31, wherein the non-motorized sensing tool is a menu-driven device having a plurality of settings, and wherein the non-motorized sensing tool includes a selector to adjust at least one of the plurality of settings.

34. The system of claim 31, wherein the non-motorized sensing tool includes a visual inspection device and the sensing element includes an image sensor, and wherein the image sensor is operable to transmit image data of a remote object to the printed circuit board.

35. The system of claim 31, wherein the non-motorized sensing tool includes a wall scanner and the sensing element includes a stud sensor operable to detect a stud behind a surface and transmit a first signal indicative of the stud to the printed circuit board.

36. The system of claim 31, wherein the non-motorized sensing tool includes a thermometer and the sensing element includes an infrared temperature sensor, and wherein the infrared temperature sensor is operable to sense a temperature of an object and transmit a signal indicative of the sensed temperature to the printed circuit board.

37. The system of claim 31, wherein the non-motorized sensing tool includes a clamp meter and the sensing element includes a current clamp, and wherein the current clamp is operable to measure electrical current in an object and transmit a signal indicative of the measured electrical current to the printed circuit board.

\* \* \* \* \*